US011440794B2

(12) United States Patent
Costantini et al.

(10) Patent No.: US 11,440,794 B2
(45) Date of Patent: Sep. 13, 2022

(54) PROCESS FOR MANUFACTURING A MICROELECTROMECHANICAL DEVICE WITH A MOBILE STRUCTURE, IN PARTICULAR A MICROMIRROR

(71) Applicant: STMicroelectronics S.r.l., Agrate Brianza (IT)

(72) Inventors: Sonia Costantini, Lecco (IT); Davide Assanelli, Milan (IT); Aldo Luigi Bortolotti, Pantigliate (IT); Michele Vimercati, Giussano (IT); Igor Varisco, Settimo Milanese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 425 days.

(21) Appl. No.: 16/565,803

(22) Filed: Sep. 10, 2019

(65) Prior Publication Data

US 2020/0079645 A1 Mar. 12, 2020

(30) Foreign Application Priority Data

Sep. 12, 2018 (IT) .......................... 102018000008533

(51) Int. Cl.
*G02B 26/00* (2006.01)
*B81C 1/00* (2006.01)
(Continued)

(52) U.S. Cl.
CPC .......... *B81C 1/00182* (2013.01); *B81B 7/008* (2013.01); *B81B 7/02* (2013.01);
(Continued)

(58) Field of Classification Search
CPC ....... B81C 1/00182; B81B 7/008; B81B 7/02; B81B 2201/042; B81B 2203/0315; G02B 26/0833; H04N 9/3102
(Continued)

(56) References Cited

U.S. PATENT DOCUMENTS

2012/0287492 A1* 11/2012 Lee ................... G02B 26/0841
359/199.2

FOREIGN PATENT DOCUMENTS

EP 3276392 A1 1/2018
WO 2012155080 A1 11/2012

OTHER PUBLICATIONS

IT Search Report and Written Opinion for IT Appl. No. 102018000008533 dated May 13, 2019 (8 pages).

* cited by examiner

*Primary Examiner* — William Choi
(74) *Attorney, Agent, or Firm* — Crowe & Dunlevy

(57) ABSTRACT

A bottom semiconductor region is formed to include a main sub-region, extending through a bottom dielectric region that coats a semiconductor wafer, and a secondary sub-region which coats the bottom dielectric region and surrounds the main sub-region. First and second top cavities are formed through the wafer, delimiting a fixed body and a patterned structure that includes a central portion which contacts the main sub-region, and deformable portions in contact with the bottom dielectric region. A bottom cavity is formed through the bottom semiconductor region, as far as the bottom dielectric region, the bottom cavity laterally delimiting a stiffening region including the main sub-region and leaving exposed parts of the bottom dielectric region that contact the deformable portions and parts of the bottom dielectric region that delimit the first and second top cavities. The parts left exposed by the bottom cavity are selectively removed.

16 Claims, 26 Drawing Sheets

(51) Int. Cl.
*B81B 7/00* (2006.01)
*B81B 7/02* (2006.01)
*G02B 26/08* (2006.01)
*H04N 9/31* (2006.01)

(52) U.S. Cl.
CPC ....... *G02B 26/0833* (2013.01); *H04N 9/3102* (2013.01); *B81B 2201/042* (2013.01); *B81B 2203/0315* (2013.01)

(58) Field of Classification Search
USPC .................................. 359/212.1, 224.1, 290
See application file for complete search history.

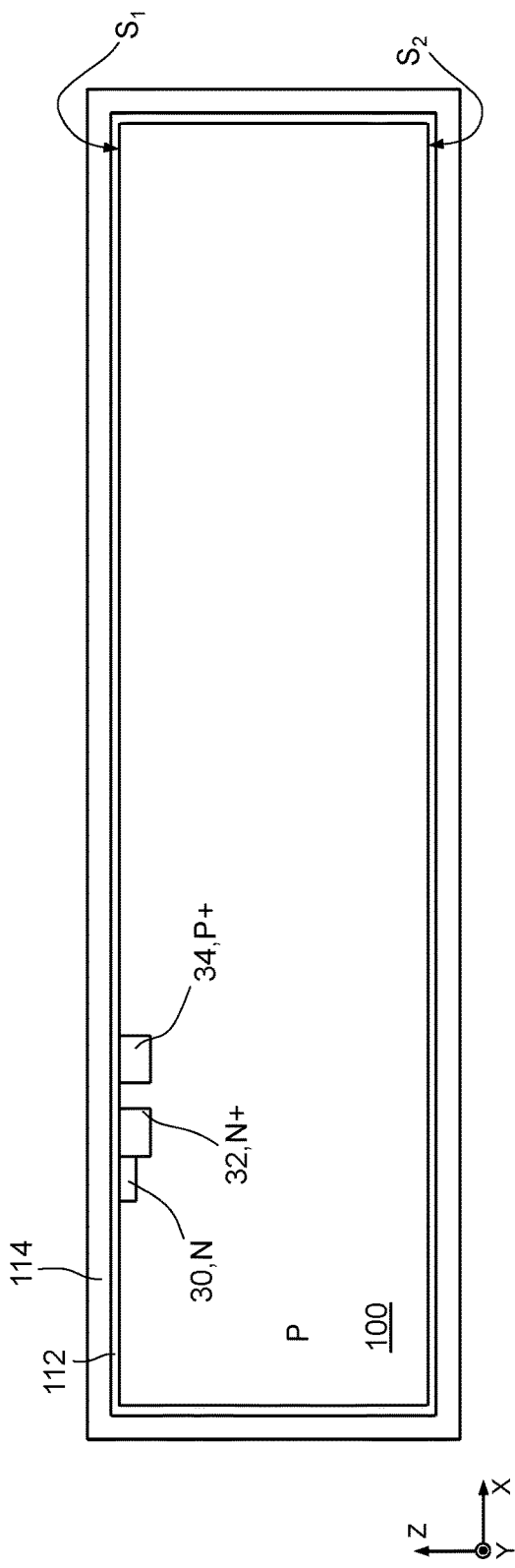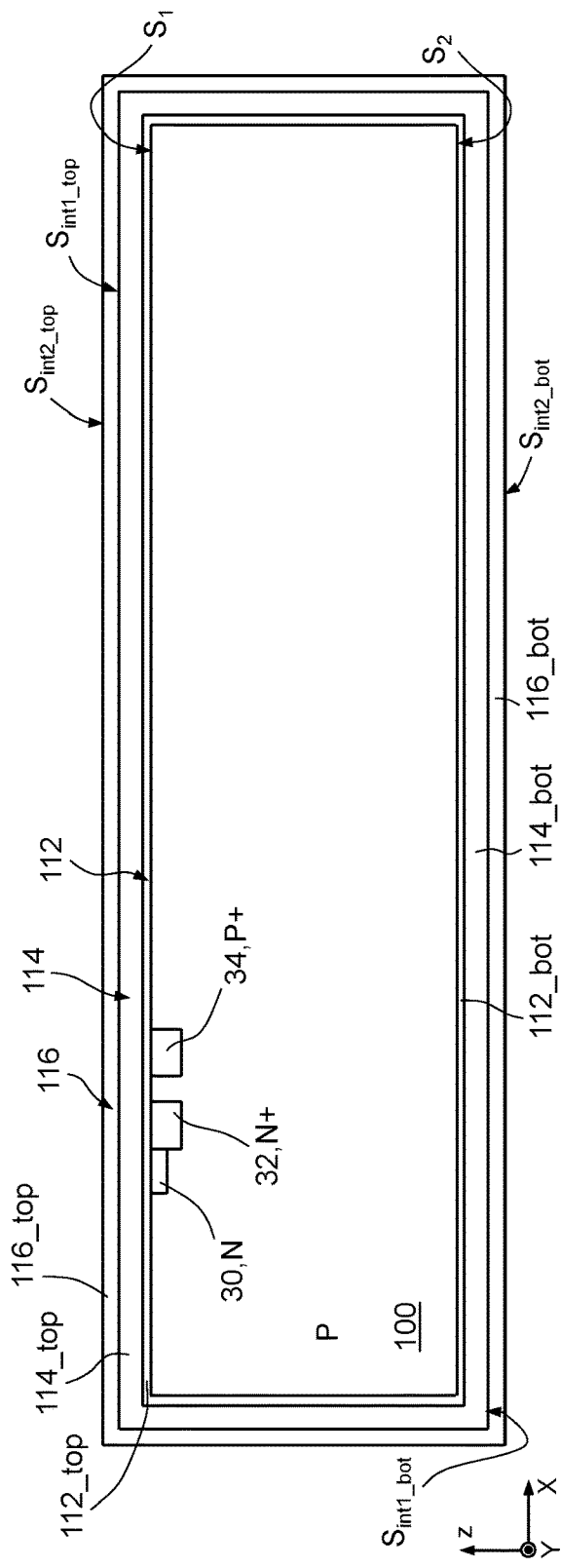

PROCESS FOR MANUFACTURING A MICROELECTROMECHANICAL DEVICE WITH A MOBILE STRUCTURE, IN PARTICULAR A MICROMIRROR

PRIORITY CLAIM

This application claims the priority benefit of Italian Application for Patent No. 102018000008533, filed on Sep. 12, 2018, the content of which is hereby incorporated by reference in its entirety to the maximum extent allowable by law.

TECHNICAL FIELD

This disclosure relates to a process for manufacturing a microelectromechanical device with a mobile structure, in particular a micromirror.

BACKGROUND

Known to the art are MEMS (MicroElectroMechanical System) devices having a mirror structure obtained using semiconductor technology.

The above MEMS devices are, for example, used in portable apparatuses, such as portable computers, laptops, notebooks (including ultra-thin notebooks), PDAs, tablets, smartphones, for optical applications, in particular for directing beams of light radiation generated by a light source in desired scan patterns or modalities.

Thanks to the small dimensions, these devices enable stringent requisites regarding the occupation of space, in terms of area and thickness, to be met.

For instance, mirror MEMS devices are used in miniaturized projector modules (e.g., picoprojectors), which are able to project images or generate desired patterns of light at a distance.

MEMS mirror devices generally include a mirror element (which in some cases may be suspended over a cavity) obtained starting from a body of semiconductor material in such a way as to be mobile, typically with movement of inclination or rotation, for directing the incident light beam in a desired way.

For instance, FIG. 1 is a schematic illustration of a picoprojector 9 comprising a light source 1, typically a laser source, which generates a light beam 2 made up of three monochromatic beams, one for each base color. Through an optical system 3 illustrated only schematically, each monochromatic beam is deflected towards a screen 6 by a MEMS device 5 that includes a mirror. In the example illustrated, the MEMS device 5 is of a biaxial type; i.e., it can be controlled so as to rotate the mirror both about a vertical axis V and about a horizontal axis H. Rotation of the mirror of the MEMS device 5 about the vertical axis V generates a fast horizontal scan of the screen 6. Rotation of the mirror of the MEMS device 5 about the horizontal axis B, perpendicular to the vertical axis V, generates a slow vertical scan of the screen 6, typically a sawtooth scan.

In a variant represented in FIG. 1, the system comprises two MEMS devices arranged in sequence along the path of the light beam 2, each of which includes a respective mirror. Each of the two mirrors is rotatable about an axis of its own; in particular, a first mirror is rotatable about the horizontal axis H, whereas a second mirror is rotatable about the vertical axis V, so as to generate the same scanning scheme described previously.

In general, in MEMS devices, rotation of the mirror is controlled via an actuation system, generally of an electrostatic, magnetic, or piezoelectric type.

FIG. 2 shows an example of implementation of the MEMS device 5.

In detail, the MEMS device 5 comprises a die 10 of semiconductor material (for example, silicon), which forms a fixed body 11 and a mobile structure 12, which is suspended in a cavity 14 delimited by the fixed body 11. The mobile structure 12 is constrained to the fixed body 11 by a system of springs (not illustrated in FIG. 2), and in particular by arms having elastically deformable portions, such as torsion springs.

The fixed body 11 comprises, for example, a first semiconductor region 15 and a second semiconductor region 17, interposed between which is a dielectric region 18. The first and second semiconductor regions 15, 17 and the dielectric region 18 are traversed by the cavity 14. Extending over the second semiconductor region 17 is a first top region 23 of dielectric material.

The mobile structure 12 in turn comprises a first semiconductor portion 20 and a second semiconductor portion 21, as well as a respective dielectric portion 22, which is interposed between the first and second semiconductor portions 20, 21 and is fixed with respect thereto.

The first semiconductor portion 20 carries the mirror, designated by 24, and is constrained to the second semiconductor region 17 through the aforementioned springs. Moreover, extending on the first semiconductor portion 20 is a second top region 25, of dielectric material, which is laterally staggered with respect to the mirror 24. On the second top region 25 there may extend, for example, one or more magnetic actuators 27, which enable rotation of the mobile structure 12 with respect to the fixed body 11.

To guarantee proper operation, the angular position of the mobile structure 12, and hence of the mirror 24, is generally controlled via sensing elements. In fact, minor deviations of the physical or electrical characteristics of the structures, due to variability in the manufacturing lots, due to imprecisions of assembly, or due to different operating conditions, such as temperature or aging, may lead to errors in the direction of the light beam emitted.

For this purpose, generally integrated in the die 10 are also sensors for detecting the angular position of the mobile structure 12. Usually, these sensors are of a capacitive or piezoelectric type. The signals generated by these sensors may be used for implementing a control loop for controlling the actuators that govern rotation of the mobile structure 12.

All this having been said, current manufacturing processes envisage that, with reference, for example, to the MEMS device 5 illustrated in FIG. 2, the mobile structure 12 will be formed by selective removal of the semiconductor material of the die 10, which initially forms a wafer of semiconductor material, together with other portions of semiconductor material, which are to form further dice, formed inside which are corresponding MEMS devices, which are the same as one another. This selective removal of semiconductor material cannot be obtained by a timed etch, since this would entail an excessive variability between the different MEMS devices that are formed starting from the aforementioned wafer of semiconductor material. For this reason, removal is carried out in a controlled way on the basis of the presence of an etch stop formed by a dielectric layer which is to form both the dielectric region 18 of the fixed body 11 and the dielectric portion 22 of the mobile structure 12. However, the presence of the dielectric portion 22 between the first and second semiconductor portions 20, 21 of the mobile structure 12, and hence of semiconductor-dielectric interfaces, represents a reason for structural weakness. In fact, it is known that semiconductor-dielectric interfaces may represent points in which there is a concentration of mechanical stresses, which may lead to formation of cracks that may subsequently extend to other portions of the MEMS device.

SUMMARY

The aim of this disclosure is to provide a process for manufacturing a MEMS device that will overcome at least in part the drawbacks of the prior art.

According to this disclosure, a process for manufacturing a MEMS device is provided, as defined in the annexed claims.

In an embodiment, a method for manufacturing a microelectromechanical device comprises: delimiting a first semiconductor wafer by a front surface and a rear surface; coating the rear surface with a bottom dielectric region; forming at least one first bottom window through the bottom dielectric region; forming a bottom semiconductor region so that it will include at least one first main sub-region which extends through the first bottom window and contacts the first semiconductor wafer, and a secondary sub-region which coats the bottom dielectric region and laterally surrounds the first main sub-region; selectively removing portions of the first semiconductor wafer, starting from the front surface so as to form a first top cavity and a second top cavity that extend as far as the bottom dielectric region and laterally delimit a fixed supporting body and a patterned structure, the patterned structure including a central portion which contacts the first main sub-region of the bottom semiconductor region and a number of deformable portions, interposed between the central portion and the fixed supporting body, in contact with the bottom dielectric region; selectively removing portions of the bottom semiconductor region so as to form a bottom cavity that extends through the bottom semiconductor region as far as the bottom dielectric region, and laterally delimits a stiffening region including the first main sub-region of the bottom semiconductor region, the bottom cavity also extending laterally so as to expose parts of the bottom dielectric region that contact the deformable portions and parts of the bottom dielectric region that delimit the first and second top cavities; and selectively removing the parts of the bottom dielectric region left exposed by the bottom cavity, in such a way that the first and second top cavities and the bottom cavity form an overall cavity, suspended inside which is the patterned structure.

BRIEF DESCRIPTION OF THE DRAWINGS

For a better understanding, embodiments are now described, purely by way of non-limiting example, with reference to the attached drawings, wherein:

FIGS. 3-8 are schematic cross-sectional views of a wafer of semiconductor material in successive steps of the present manufacturing process;

DETAILED DESCRIPTION

Figure 27:
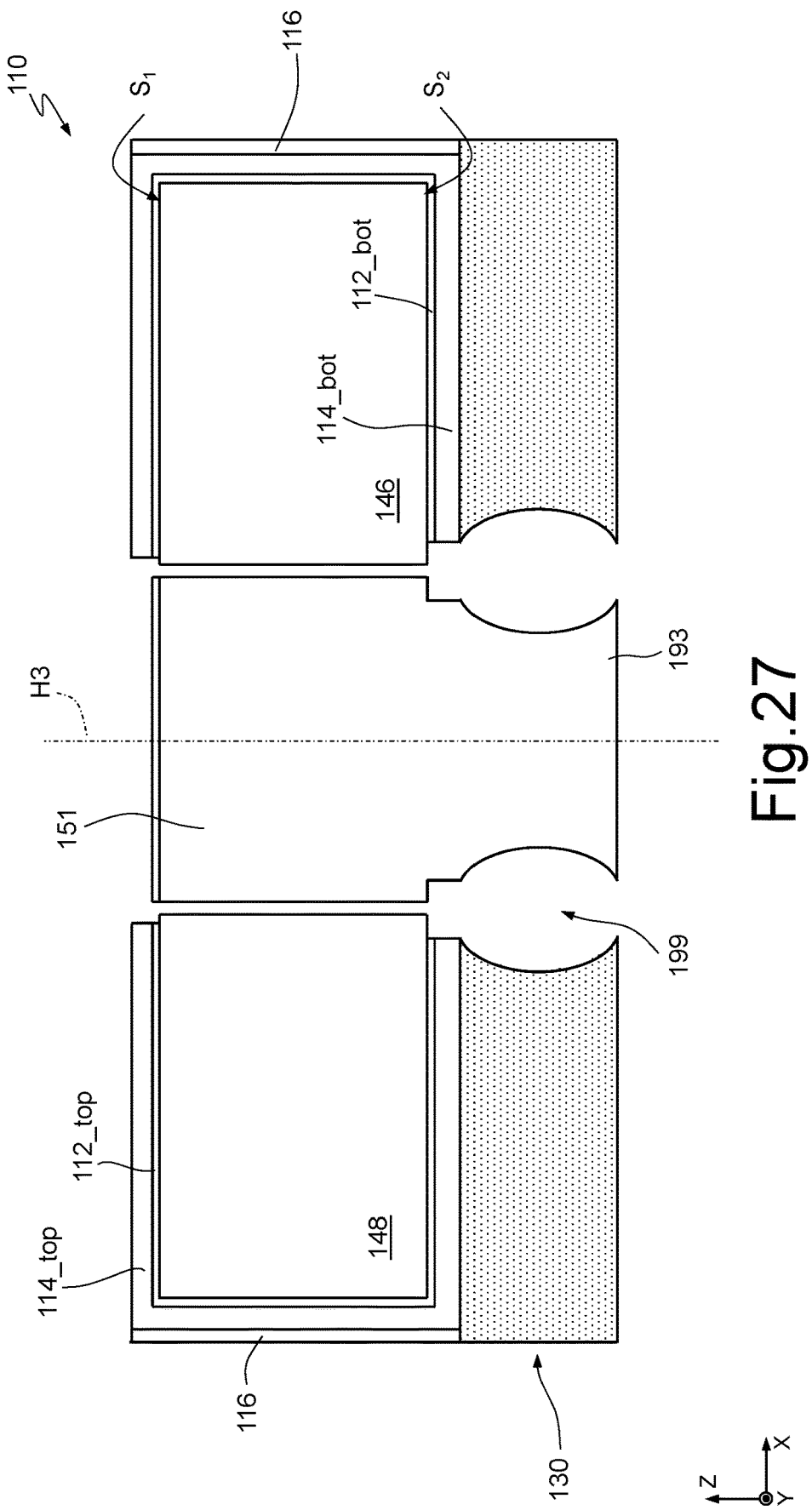

The present manufacturing process is described in what follows with reference to a first wafer 100 (FIG. 3) of semiconductor material, and in particular to a portion of the first wafer 100, in which a MEMS device 110 (FIG. 27) is provided. Other portions (not illustrated) of the first wafer 100 may be machined simultaneously so as to form a plurality of MEMS devices arranged alongside one another, which are then to be separated via a dicing step, following upon which the machined portions of the first wafer 100 form corresponding dice. However, for simplicity of description, in what follows reference will not be made to the other portions of the first wafer 100. Moreover, purely by way of example, the first wafer 100 may be formed by a corresponding layer of semiconductor material (for example, monocrystalline silicon), which has, for example, a doping of a P type and has a thickness, for example, of between 350 µm and 700 µm. In addition, the first wafer 100 is delimited by a first main surface $S_1$ and a second main surface $S_2$, which are parallel and opposite to one another.

Without this implying any loss of generality, in what follows reference is made to the top face and bottom face of the first wafer 100 to indicate the faces that form, respectively, the first and second main surfaces $S_1$, $S_2$. In this connection, in what follows, an orthogonal reference system XYZ (FIG. 3) is assumed. Moreover, in what follows, it is assumed that the terms indicating positioning with respect to the axis Z (hence, regarding the positioning in height), such as the terms "bottom", "top", "back", and "front", "overlie", "underneath", and "above", refer to the situation illustrated for example in FIG. 3, where the first wafer 100 is arranged so that the first main surface $S_1$ is arranged on top of the second main surface $S_1$, except where otherwise indicated. For this reason, the aforementioned first and second main surfaces $S_1$, $S_2$ represent, respectively, the front surface and the rear surface of the first wafer 100.

This having been said, the present manufacturing process envisages forming in the first wafer 100 the alignment signs for photolithographic masks used subsequently in the steps of selective removal of material.

Figure 3:
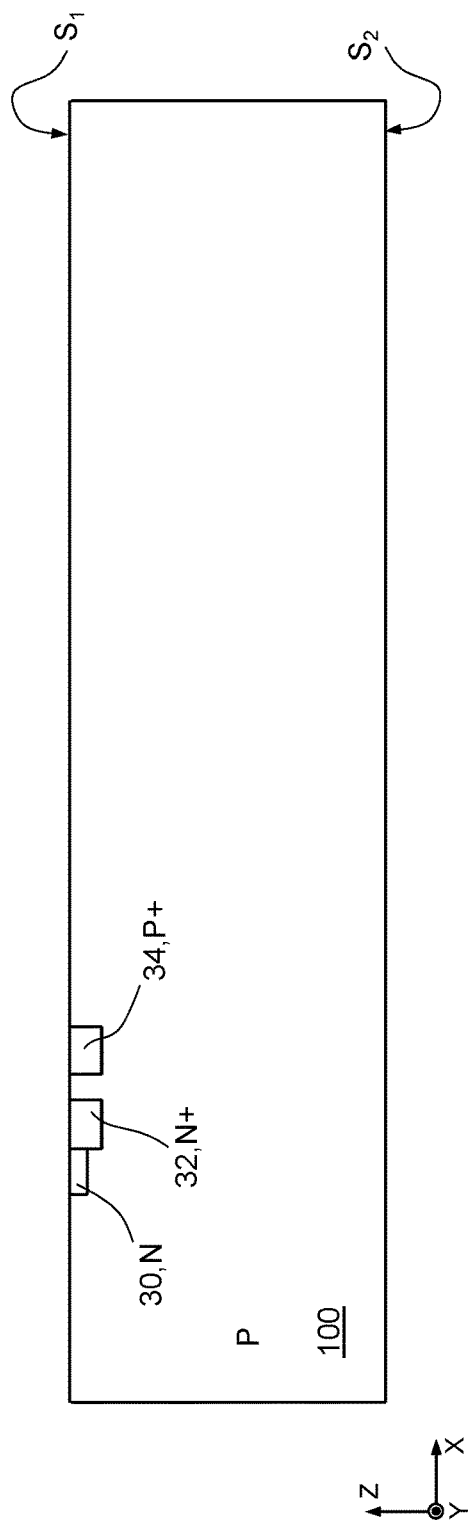

Once again, the manufacturing process envisages forming in the first wafer 100 sensing structures adapted to generate, in use, signals indicating rotation of a mobile structure, described hereinafter. For this purpose, a first selective implantation of dopant ion species of an N type (for example, phosphorus) is carried out, thus forming piezoresistors 30 (one of which is illustrated in FIG. 3). Moreover, a second selective implantation of dopant ion species of an N type is carried out, thus forming piezoresistor contact regions 32 contiguous to the piezoresistors 30 (one of which is illustrated in FIG. 3). A third selective implantation of dopant ion species of a P type (for example, boron) is moreover carried out, thus forming substrate contact regions 34 (one of which is illustrated in FIG. 3). The piezoresistors 30, the piezoresistor contact regions 32 and the substrate contact regions 34 give out onto the first main surface $S_1$.

Regarding the piezoresistors 30, the piezoresistor contact regions 32, and the substrate contact regions 34, the shapes and arrangements illustrated in the figures, which are not necessarily consistent with one another, are to be understood as purely qualitative, the corresponding details being irrelevant for the purposes of the present manufacturing process.

Figure 4:
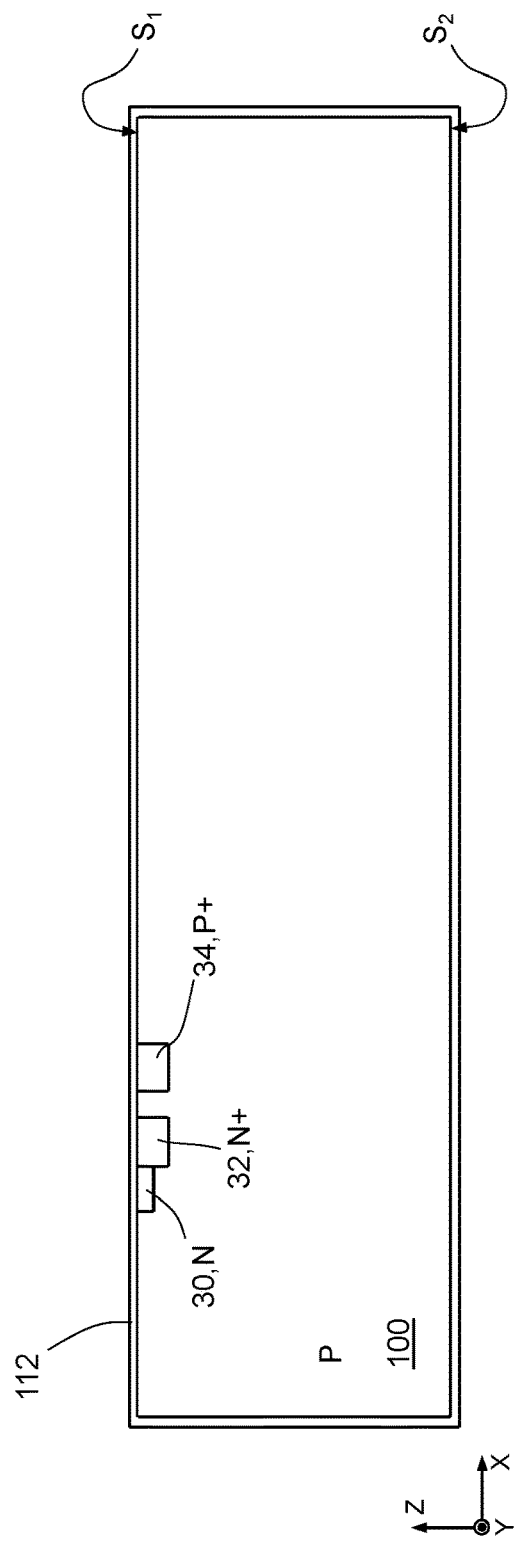

Next, as illustrated in FIG. 4, a process of thermal oxidation is carried out so as to coat the first wafer 100 with a first dielectric layer 112, which is formed by thermal oxide, has a thickness of, for example, 20 nm and hence extends over the first and second main surfaces $S_1$, $S_2$ of the first wafer 100, as well as over the side walls of the first wafer 100.

Next, as illustrated in FIG. 5, the first dielectric layer 112 is entirely coated with a second dielectric layer 114, obtained by deposition of TEOS oxide and having a thickness of, for example, 1 μm (the figures are not in scale).

As clarified hereinafter, parts of the first and second dielectric layers 112, 114 will function as buried oxide, which will function as an etch stop for selective etches described hereinafter.

Next, as illustrated in FIG. 6, the second dielectric layer 114 is entirely coated with a third dielectric layer 116, formed, for example, by LPCVD (Low-Pressure Chemical-Vapor Deposition). For instance, the third dielectric layer 116 is made silicon nitride and has a thickness of, for example, 200 nm.

Each of the first, second, and third dielectric layers 112, 114, 116 comprises a respective top portion and a respective bottom portion, which are arranged, respectively, on top of the first main surface $S_1$ and underneath the second main surface $S_2$ and are designated by the same reference number as that of the corresponding layer, with the respective suffix "_top" and "_bot". In greater detail, the top portion 112_top of the first dielectric layer 112 coats the first main surface $S_1$. The bottom portion 112_bot of the first dielectric layer 112 coats the second main surface $S_2$.

The top portion 114_top of the second dielectric layer 114 coats the top portion 112_top of the first dielectric layer 112 and is delimited at the top by a corresponding surface, referred to in what follows as the first top intermediate surface $S_{int1\_top}$.

The bottom portion 114_bot of the second dielectric layer 114 coats the bottom portion 112_bot of the first dielectric layer 112 and is delimited at the bottom by a corresponding surface, referred to in what follows as the first bottom intermediate surface $S_{int\_bot}$.

The top portion 116_top of the third dielectric layer 116 coats the top portion 114_top of the second dielectric layer 114 and is delimited at the top by a corresponding surface, referred to in what follows as the second top intermediate surface $S_{int2\_top}$.

The bottom portion 116_bot of the third dielectric layer 116 coats the bottom portion 114_bot of the second dielectric layer 114 and is delimited at the bottom by a corresponding surface, referred to in what follows as the second bottom intermediate surface $S_{int2\_bot}$.

Figure 7:
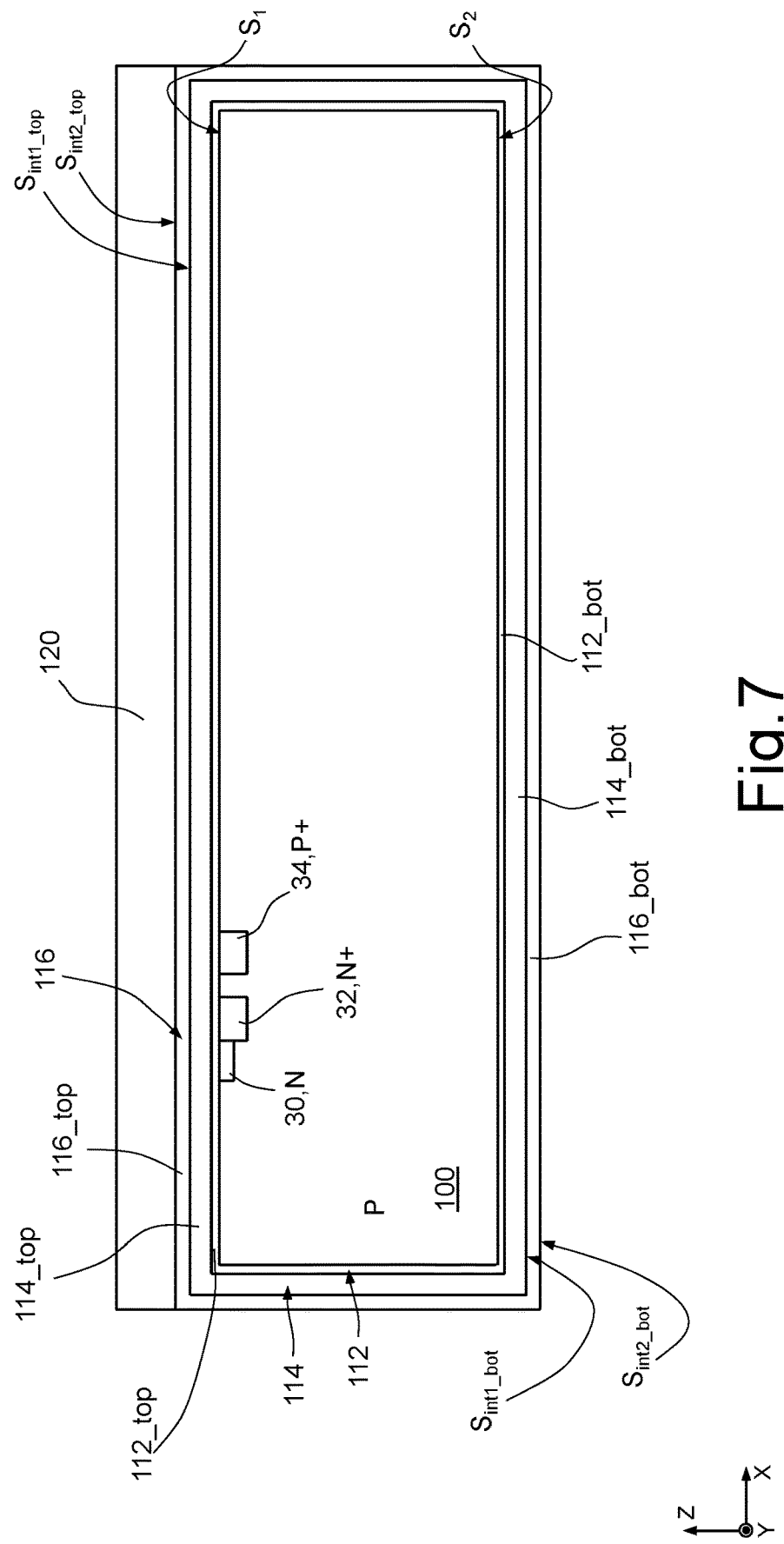

Next, as illustrated in FIG. 7, on the second top intermediate surface $S_{int2\_top}$ a protective dielectric region 120 is formed, for example by plasma deposition. The protective dielectric region 120 may be made of TEOS oxide and have a thickness of, for example, 1200 nm.

Figure 8:
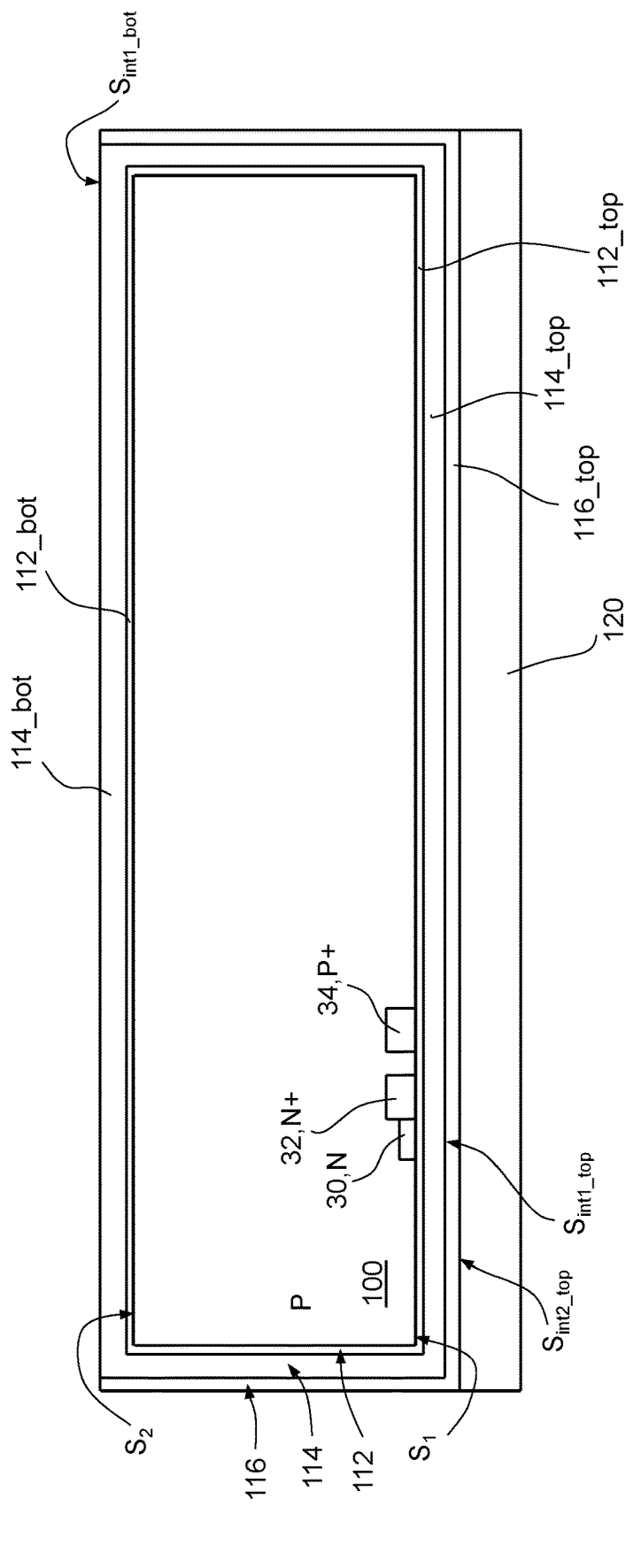

Then, as illustrated in FIG. 8, the first wafer 100 is flipped over. In addition, optionally, on the front of the first wafer 100 a temporary protection may be used so as to prevent possible damage during the operations of machining of the back of the first wafer 100. For simplicity of description, in what follows it is assumed in any case that the aforementioned temporary protection is not used.

Once again with reference to FIG. 8, an operation of removal of the bottom portion 116_bot of the third dielectric layer 116 is carried out so as to expose the first bottom intermediate surface $S_{int1\_bot}$.

Figure 9:
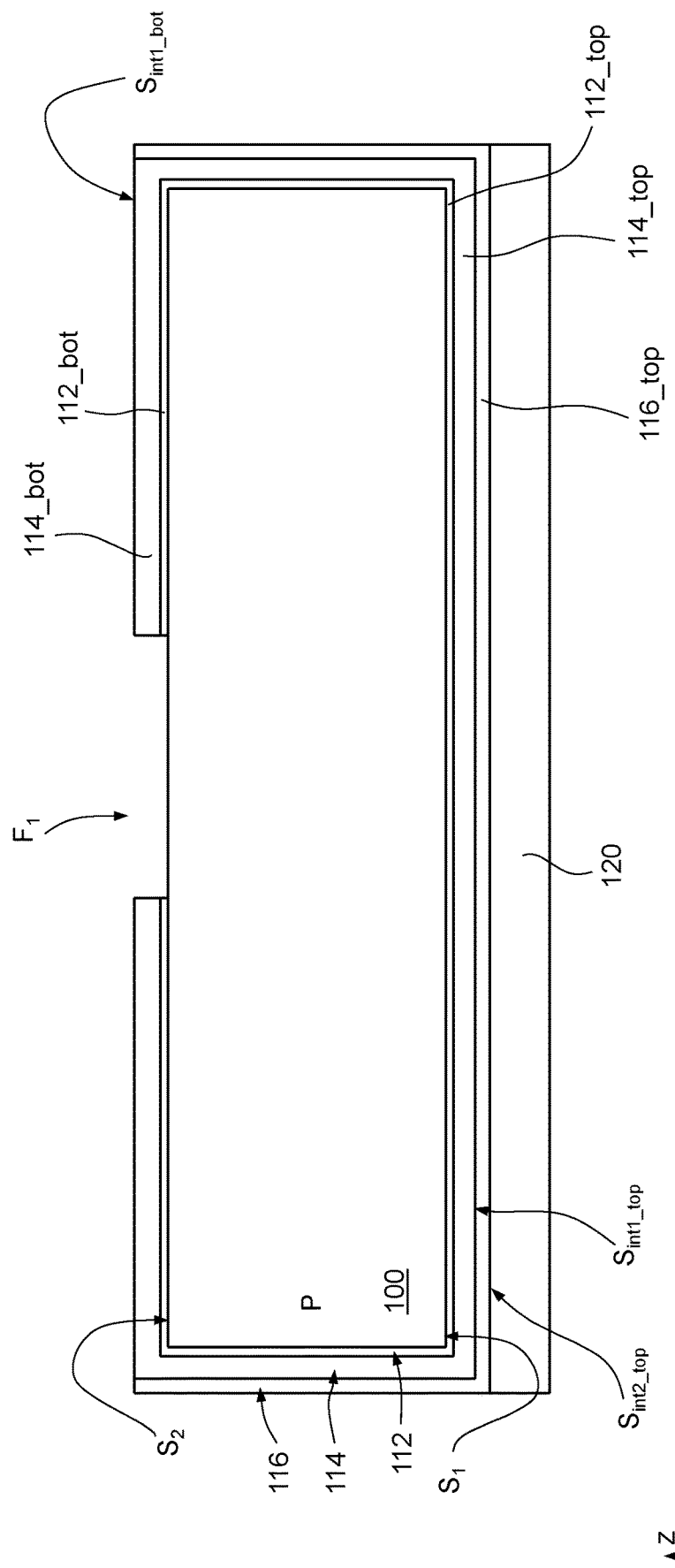
FIG. 9 is a schematic cross-sectional view of the wafer of semiconductor material, taken along the lines of section IX-IX, illustrated in FIG. 10.

Next, as illustrated in FIG. 9, selective removal is carried out of a part of the bottom portion 114_bot of the second dielectric layer 114, starting from the first bottom intermediate surface $S_{int1\_bot}$, and of an adjacent part of the bottom portion 112_bot of the first dielectric layer 112, in order to form a first window $F_1$, which traverses the bottom portions 112_bot, 114_bot of the first and second dielectric layers 112, 114, so as to expose a corresponding part of the second main surface $S_2$ of the first wafer 100, and hence a corresponding bottom part of the first wafer 100, which gives out on this window. For this purpose, two etches may be carried out, for example, in succession (for instance, a first dry etch and a subsequent wet etch) to remove, respectively, the parts of the bottom portions 112_bot, 114_bot of the first and second dielectric layers 112, 114.

Once again with reference to FIG. 9, not visible therein are the piezoresistors, the piezoresistor contact regions, and the substrate contact regions, since, for simplicity of description, it is assumed that FIG. 9 refers to a section of the first wafer 100 different from that of the previous FIGS. 3-8. In any case, as mentioned previously, the shapes and arrangements of the piezoresistors, the piezoresistor contact regions, and the substrate contact regions are irrelevant for the purposes of the present process.

Figure 10:
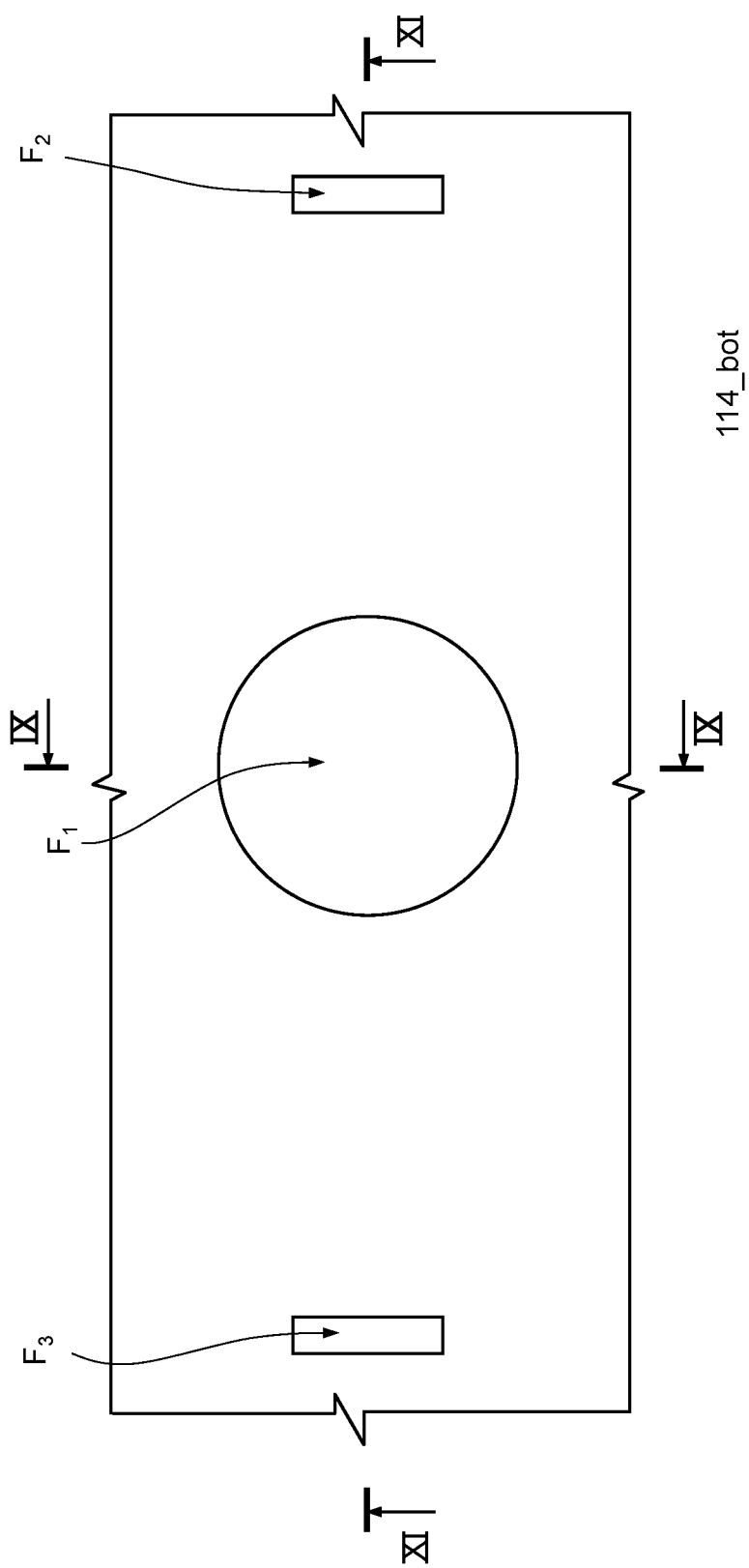
FIG. 10 is a schematic top plan view of a part of the wafer of semiconductor material, during a corresponding step of the present manufacturing process.

As illustrated in FIG. 10, the first window $F_1$ may have a cylindrical shape, in which case in top plan view it has a circular shape.

Figure 11:
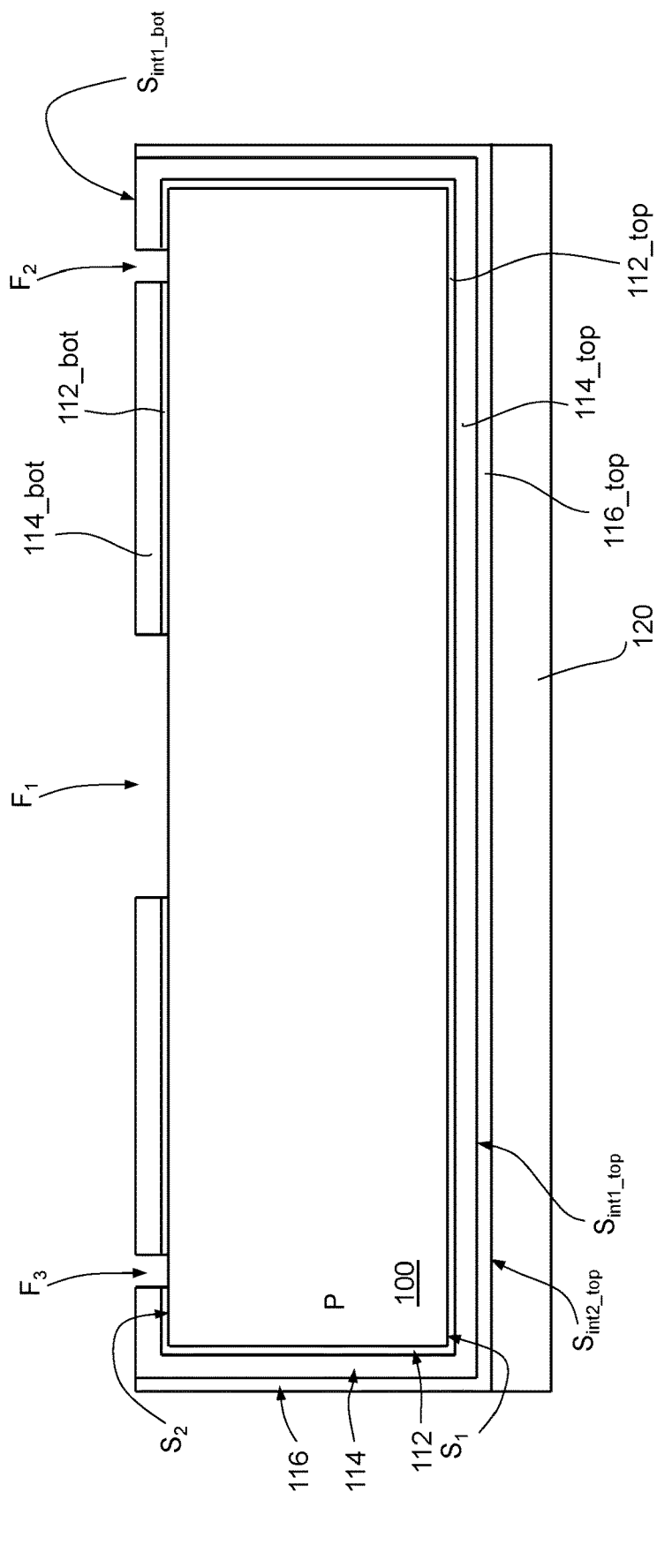
FIG. 11 is a schematic cross-sectional view of the wafer of semiconductor material, taken along the lines of section XI-XI, illustrated in FIG. 10.

As shown once again in FIG. 10 and in FIG. 11, at the same time as the first window $F_1$ is formed, also a second window $F_2$ and a third window $F_3$ are formed, which are the same as one another, have, for example, the shape of parallelepipeds, and are arranged in a symmetrical way with respect to the first window $F_1$, in a direction parallel to the axis X.

Once again with reference to FIGS. 9 and 11, these show orthogonal sections (in planes illustrated in FIG. 10) in so far as they are taken in planes parallel, respectively, to the plane XZ and to the plane YZ. Purely for reasons of convenience of representation, the section illustrated in FIG. 9 has an extension, measured parallel to the axis X, approximately equal to the extension of the section illustrated in FIG. 11, measured parallel to the axis Y.

In practice, the foregoing operations enable patterning of the macroregion dielectric formed by the bottom portions 112_bot, 114_bot of the first and second dielectric layers 112, 114.

Figure 12:
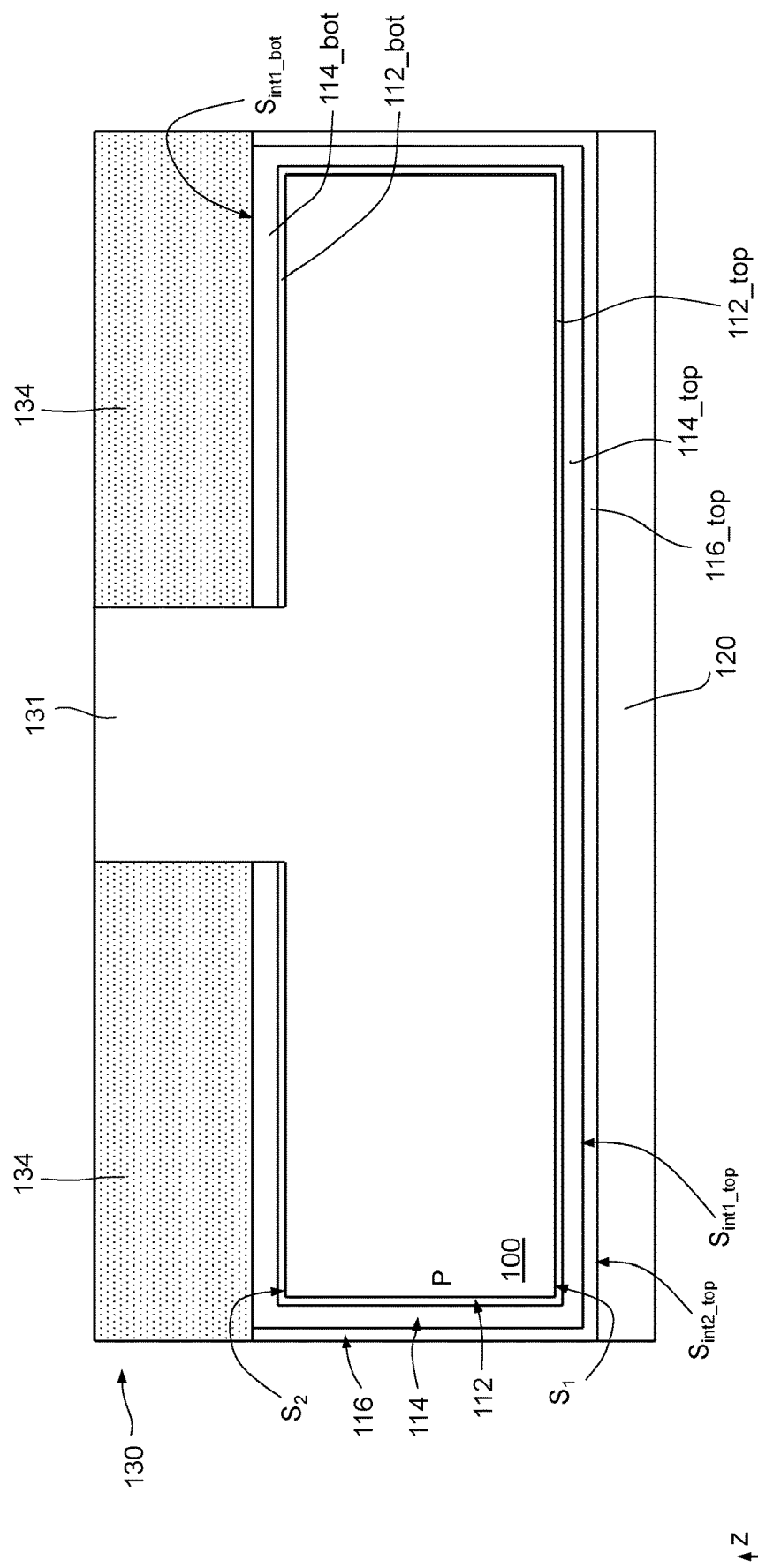
FIGS. 12, 17, 20-23, and 25-27 show the schematic cross section of FIG. 9, in successive steps of the present manufacturing process.
Figure 13:
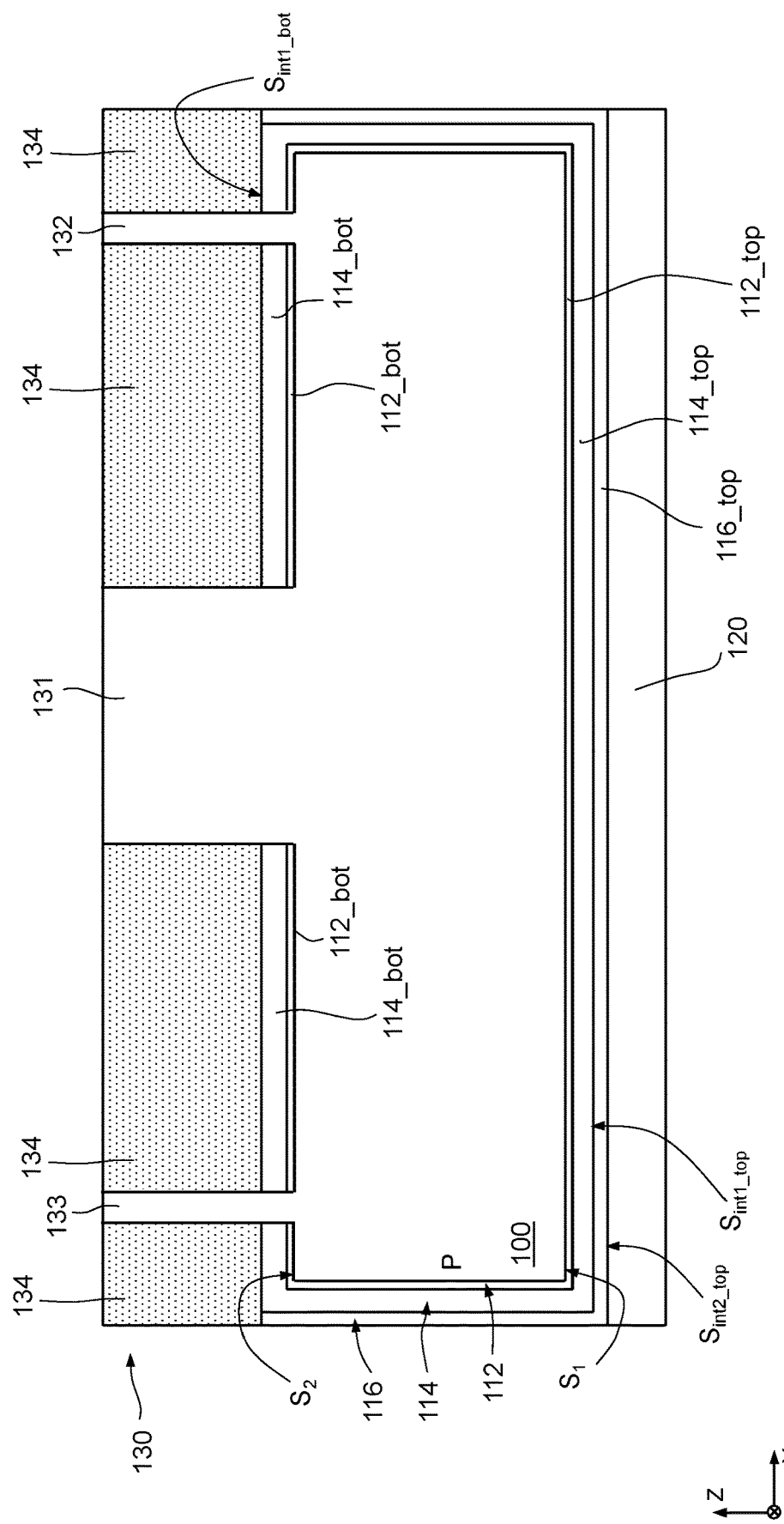
FIGS. 13, 14, and 16 show schematically the cross section illustrated in FIG. 11 in successive steps of the present manufacturing process.

This is followed by an operation of polishing (optional, not illustrated) of the first bottom intermediate surface $S_{int1\_bot}$. Moreover, as illustrated in FIGS. 12 and 13, an epitaxial growth of semiconductor material is carried out through the first, second, and third windows $F_1$, $F_2$, $F_3$, starting from the second main surface $S_2$; this operation brings about formation of a bottom semiconductor region 130, which extends over the first bottom intermediate surface $S_{int1\_bot}$ as well as within the first, second, and third windows $F_1$, $F_2$, $F_3$.

The bottom semiconductor region 130 comprises a first main sub-region 131, a second main sub-region 132, and a third main sub-region 133, which are made of monocrystalline silicon, form a single monolithic monocrystalline region with the first wafer 100 and extend, respectively, in the first, second, and third windows $F_1$, $F_2$, $F_3$. Moreover, the first, second, and third main sub-regions 131, 132, 133 are separate from one another and each include a respective inner portion, which fills the corresponding window, and an outer portion, which in top plan view has the same shape as the corresponding inner portion, and hence as the corresponding window, and is arranged outside of the respective window, in such a way that each inner portion is interposed between the corresponding outer portion and the first wafer 100. In other words, each one of the first, second, and third main sub-regions 131, 132, 133 extends from the first wafer 100 outwards, passing though the corresponding window and projecting out of the window; moreover, in top plan view, each one of the first, second, and third main sub-regions 131, 132, 133 has the same shape as the corresponding window.

The bottom semiconductor region 130 further comprises a secondary sub-region 134, which is made of polycrystalline silicon and coats the first bottom intermediate surface $S_{int1\_bot}$, in direct contact with the bottom portion 114_bot of the second dielectric layer 114. In particular, the secondary sub-region 134 laterally surrounds, in direct contact, the aforementioned outer portions of the first, second, and third main sub-regions 131, 132, 133.

The bottom semiconductor region 130 may have an initial thickness, for example, of 110 μm, which is subsequently reduced, for example, to 100 μm by a CMP (Chemical-Mechanical Polishing) operation (step not shown).

In greater detail, formation of the bottom semiconductor region 130 may be obtained by an epitaxial growth in a reactor, with the use of silane and with initial use of a polysilicon seed layer (not shown), formed on the first bottom intermediate surface $S_{int1\_bot}$ and on the exposed portion of the second main surface $S_2$ of the first wafer 100.

Figure 14:
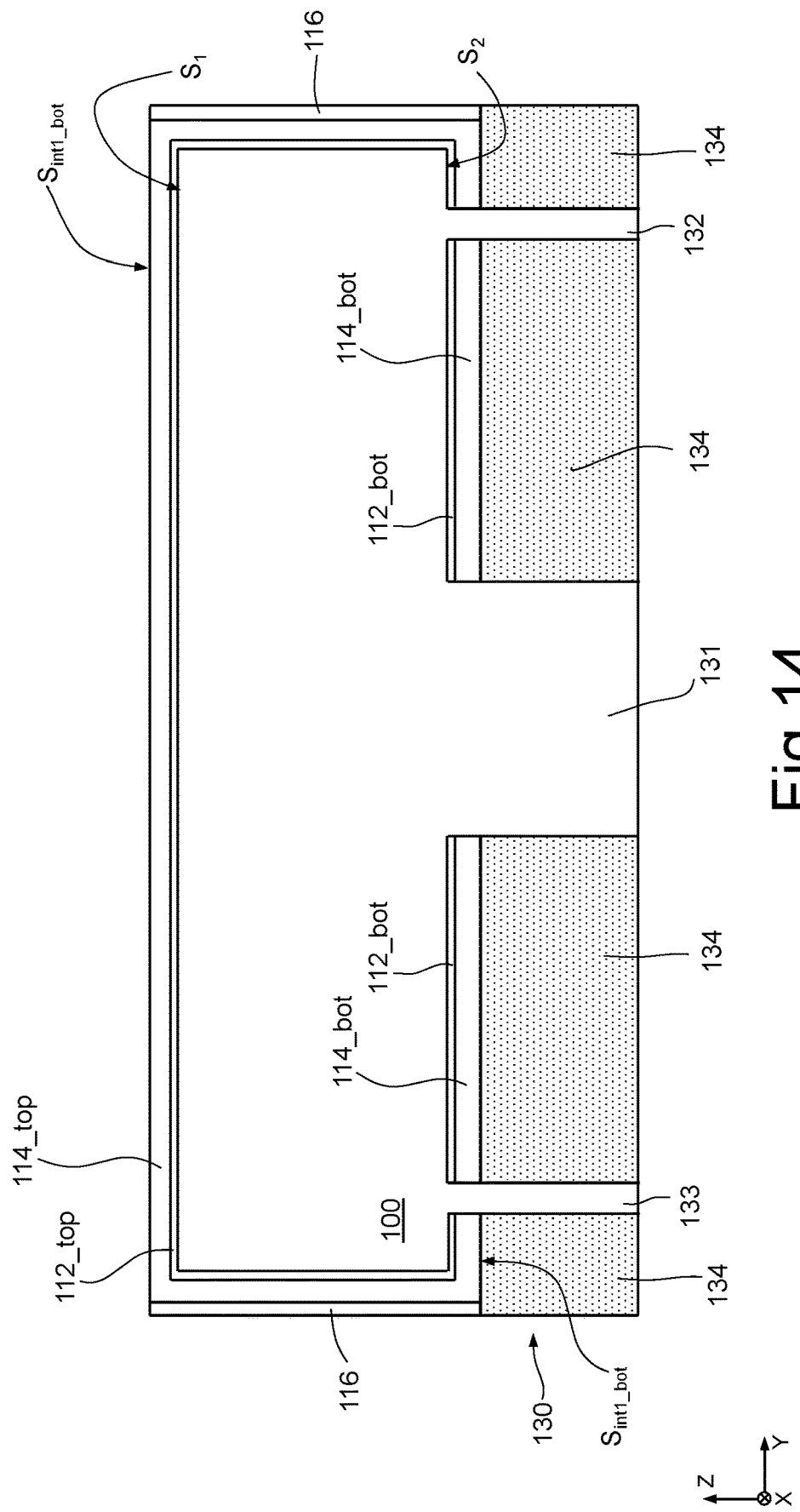

Next, as illustrated in FIG. 14, the first wafer 100 is again flipped over. In addition, the protective dielectric region 120 is removed, for example by a chemical etch carried out using hydrofluoric acid (HF). Next, the top portion 116_top of the third dielectric layer 116 is removed (for example, by a dry plasma etch) so as to expose the first top intermediate surface $S_{int1\_top}$.

Once again with reference to the protective dielectric region 120, as well as to the top portion 116_top of the third dielectric layer 116, these enable temporary protection of the top face of the first wafer 100. Moreover, since the third dielectric layer 116 is made of a material different from that of the protective dielectric region 120 and from that of the first and second dielectric layers 112, 114, the top portion 116_top of the third dielectric layer 116 and the first top dielectric region 120 can be etched selectively, without damaging the first and second dielectric layers 112, 114.

Figure 15:
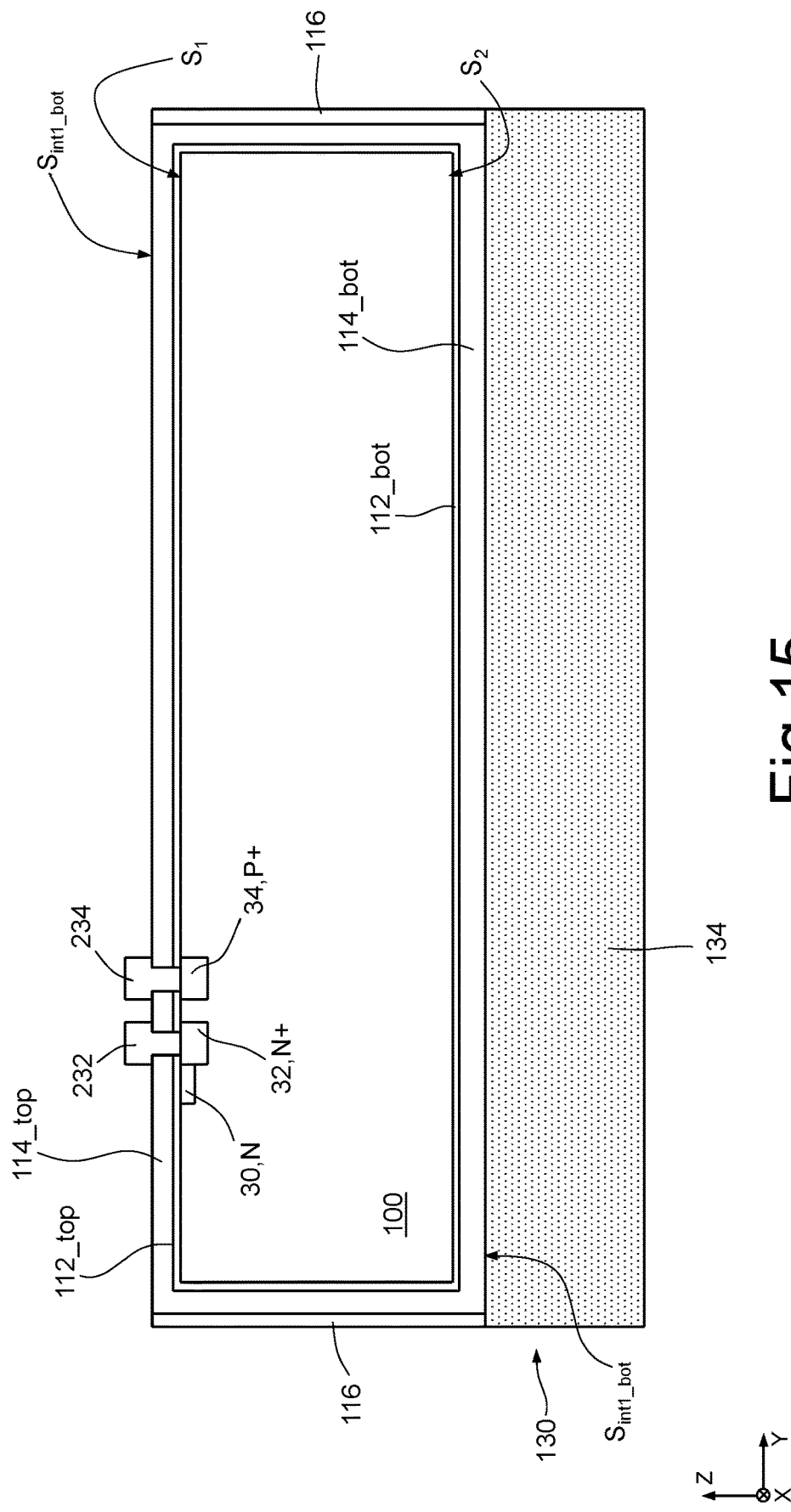
FIG. 15 shows the cross section illustrated in FIGS. 3-8, in a subsequent step of the present manufacturing process.

Next, as illustrated in FIG. 15, contact metallizations 232 (just one of which is illustrated in FIG. 15) and substrate metallizations 234 (just one of which is illustrated in FIG. 15) are formed. For simplicity, FIG. 15 regards the same cross section as the one represented in FIGS. 3-8.

In particular, the contact metallizations 232 extend through the top portions 112_top, 114_top of the first and second dielectric layers 112, 114 so as to contact corresponding piezoresistor contact regions. The substrate metallizations 234 extend through the top portions 112_top, 114_top of the first and second dielectric layers 112, 114 so as to contact corresponding substrate contact regions.

Each of the contact metallizations 232 and substrate metallizations 234 may be formed by a corresponding conductive multilayer structure, made of different metals.

Figure 16:
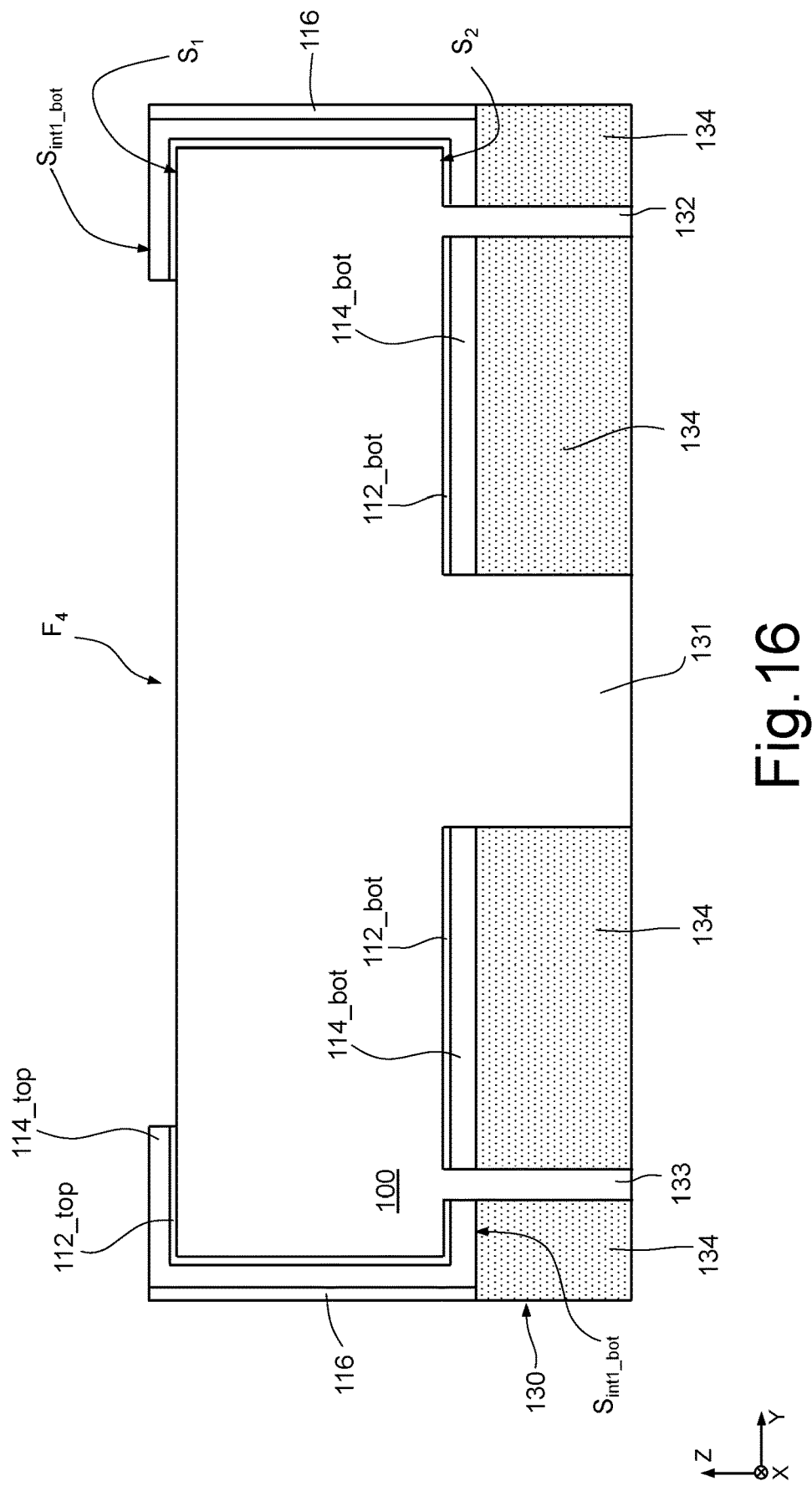

There then follows, as illustrated in FIG. 16, selective removal of a part of the top portion 114_top of the second dielectric layer 114, starting from the first top intermediate surface $S_{int1\_top}$, and of an underlying part of the top portion 112_top of the first dielectric layer 112 so as to expose a part of the first main surface $S_1$ of the first wafer 100. In practice, a fourth window $F_4$ is formed, which extends through the top portions 112_top, 114_top of the first and second dielectric layers 112, 114. For this purpose, there may be carried out, for example, two etches in succession (for example, a first dry etch and a subsequent wet etch) to remove, respectively, parts of the top portions 112_top, 114_top of the first and second dielectric layers 112, 114.

In practice, formation of the fourth window $F_4$ enables exposure of a corresponding top part of the first wafer 100, which gives out onto the fourth window $F_4$. In this connection, FIG. 17 refers to the same operating step as the one illustrated in FIG. 16; however, whereas FIG. 16 refers to the same section as the one illustrated in FIGS. 11, 13, and 14, FIG. 17 refers to the same section as the one illustrated in FIGS. 9 and 12.

Figure 18:
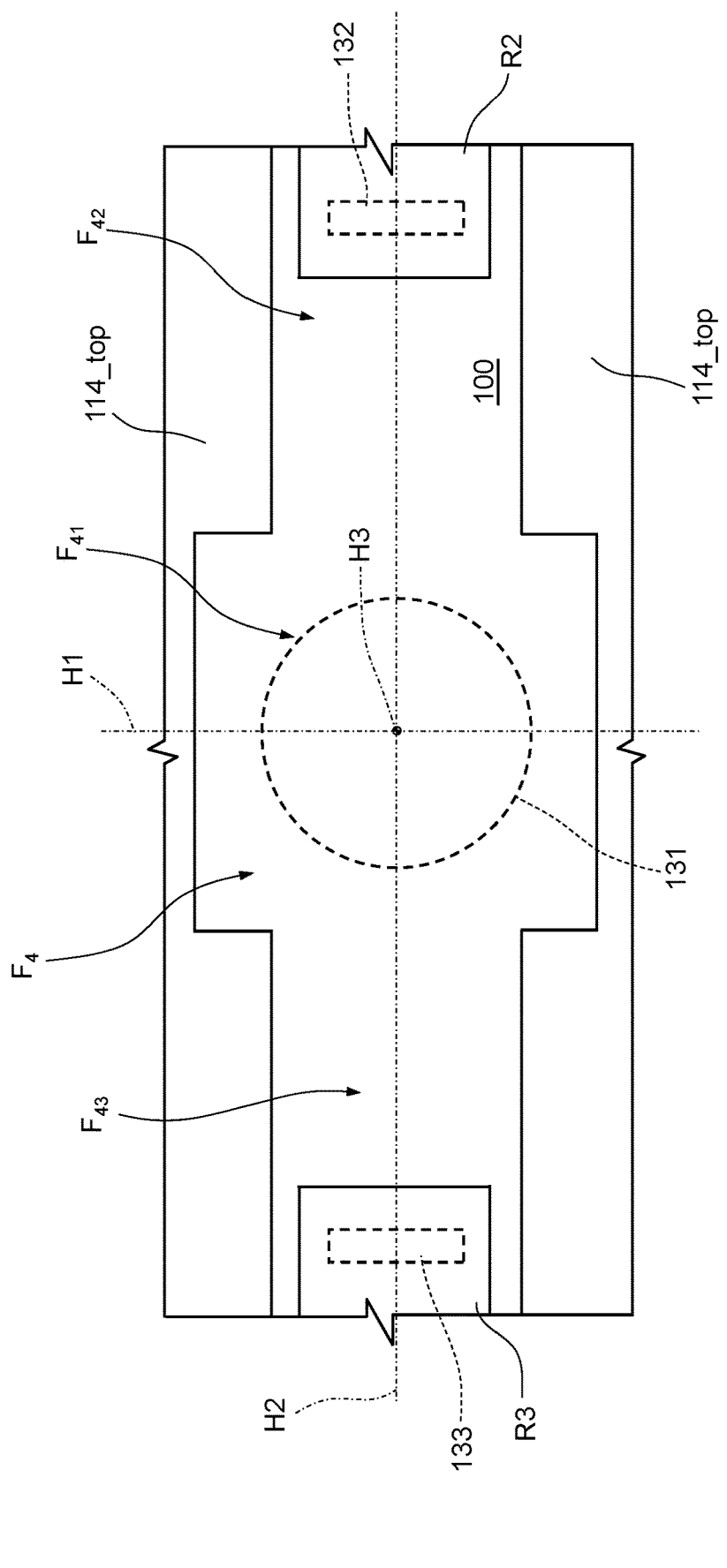
FIG. 18 is a schematic top plan view of a part of the wafer of semiconductor material, during the same step as that of FIGS. 16 and 17.

Without this implying any loss of generality, as shown in FIG. 18, in top plan view (in other words, with reference to the projection in a plane parallel to the plane XY), the fourth window $F_4$ has a symmetrical shape with respect to a first axis H1, parallel to the plane ZX, as well as with respect to a second axis H2, parallel to the plane YZ. Moreover, the fourth window $F_4$ comprises a central portion $F_{41}$, which has the shape of a parallelepiped having a third axis H3 parallel to the axis Z and passing through a point of intersection of the aforementioned first and second axes H1, H2. The fourth window $F_4$ further comprises a first peripheral portion $F_{42}$ and a second peripheral portion $F_{43}$, which are the same as one another and are arranged in a symmetrical way with respect to the central portion $F_{41}$.

In greater detail, the central portion $F_{41}$ overlies, at a distance, the first main sub-portion 131 of the bottom semiconductor region 130, which has an axis that coincides with the third axis H3. In this connection, to facilitate understanding, FIG. 18 shows as dashed the profile of the first main sub-portion 131, and likewise the profiles of the second and third main sub-regions 132, 133 of the bottom semiconductor region 130.

In even greater detail, the first main sub-portion 131 of the bottom semiconductor region 130 is entirely overlaid, at a distance, by the quadrangular base of the parallelepipedal shape of the central portion $F_{41}$ of the fourth window $F_4$.

In addition, in top plan view, each of the first and second peripheral portions $F_{42}$, $F_{43}$ of the fourth window $F_4$ has to a first approximation a "C" shape facing in a direction opposite to the central portion $F_{41}$, i.e., with its concavity facing outwards, the central portion of the "C" merging with the central portion $F_{41}$ of the fourth window $F_4$. Moreover, the "C" shape has, in a direction parallel to the axis X, a maximum dimension smaller than the corresponding dimension of the base of the central portion $F_{41}$.

Each of the first and second peripheral portions $F_{42}$, $F_{43}$ of the fourth window $F_4$ houses, within its own "C" shape, corresponding first and second residual parts of the top portion 114_top of the second dielectric layer 114, denoted, respectively, by R2 and R3 in FIG. 18. The first and second residual parts R2, R3 of the top portion 114_top of the second dielectric layer 114 overlie at a distance, respectively, the second and third main sub-regions 132, 133 of the bottom semiconductor region 130.

Figure 19:
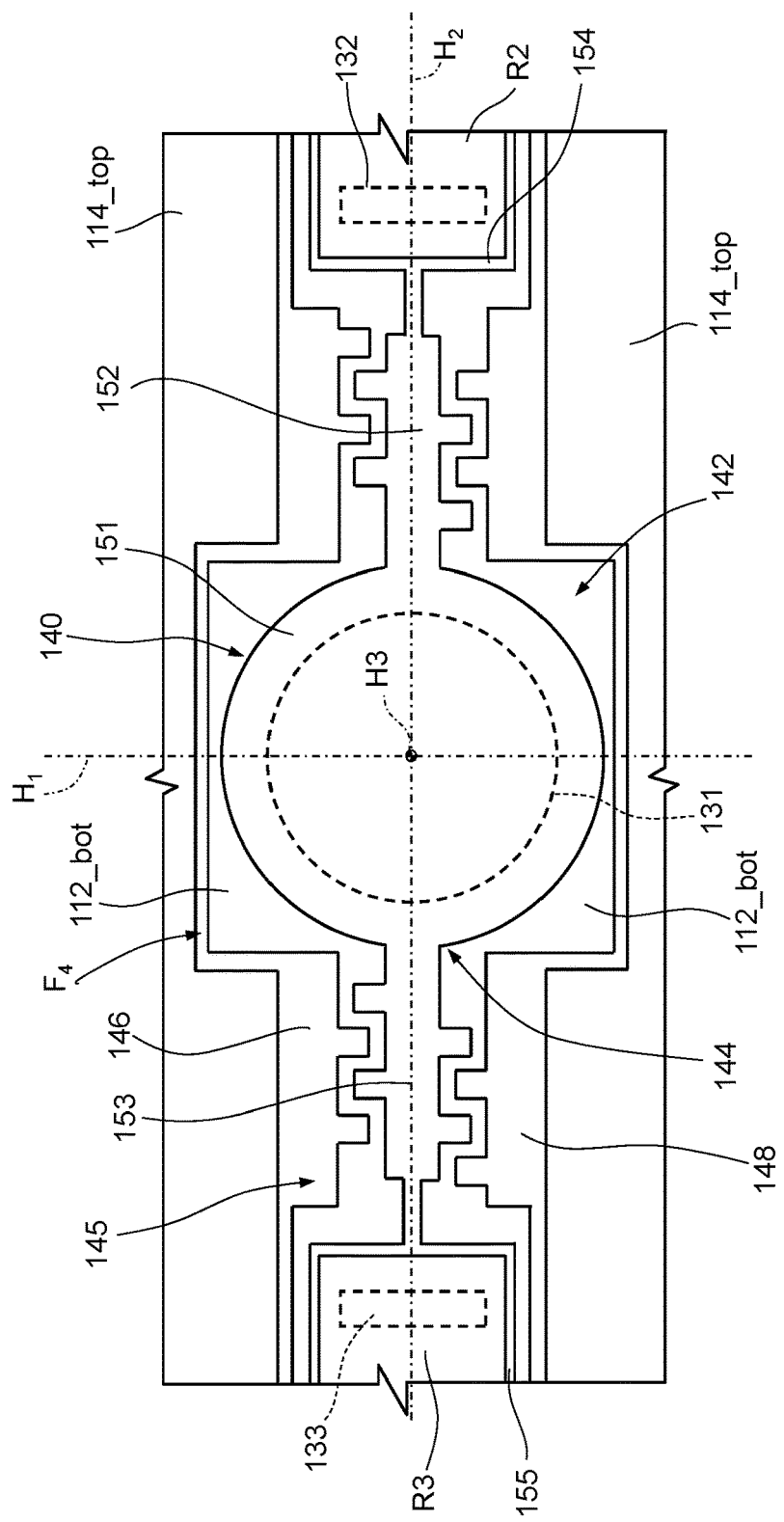
FIG. 19 is a schematic top plan view of a part of the wafer of semiconductor material, during the same step as that of FIG. 20.
Figure 20:
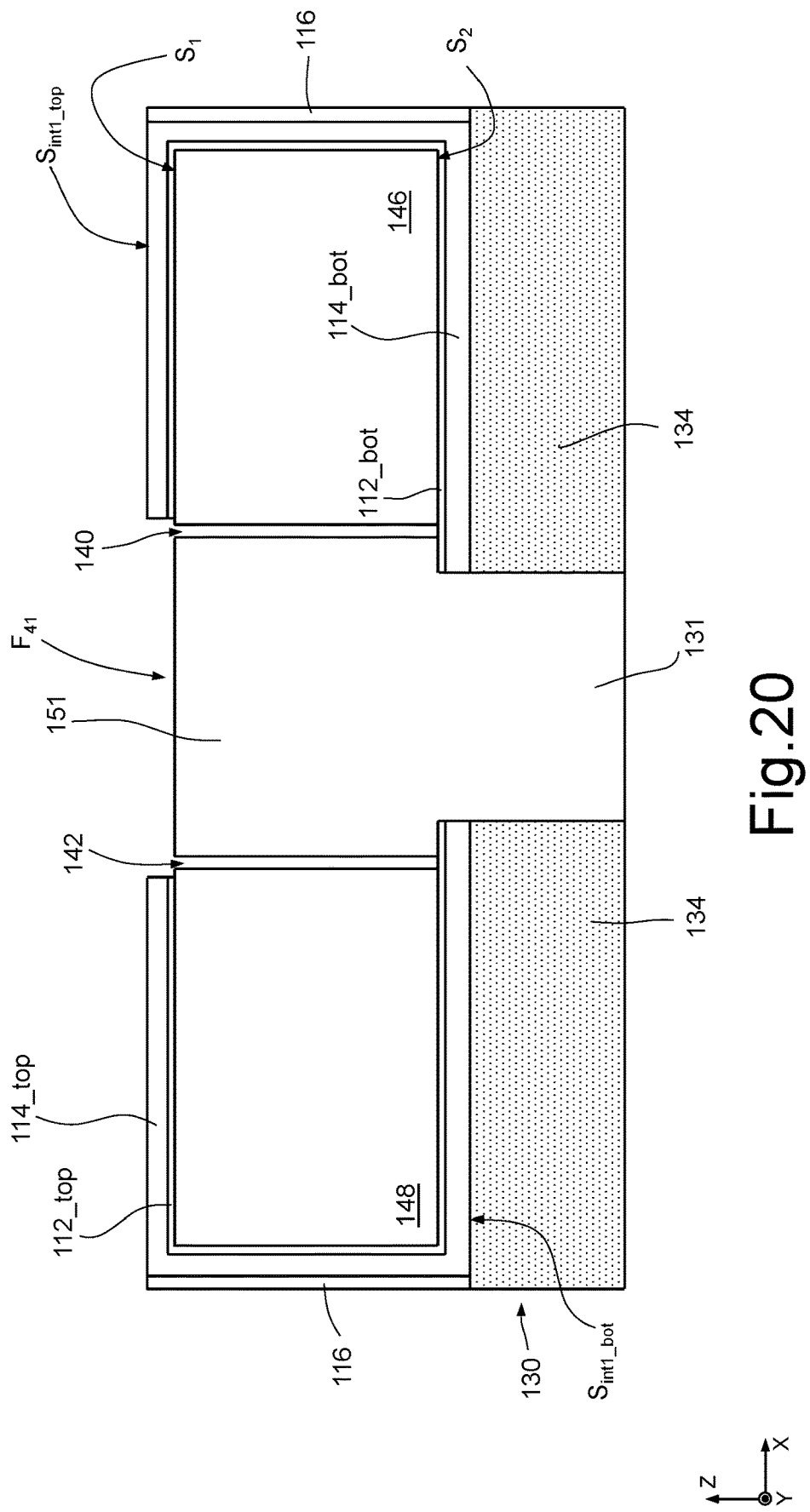

Next, as illustrated in FIGS. 19 and 20, portions of the part of the first wafer 100 that gives out onto on the central portion $F_{41}$ of the fourth window $F_4$ are selectively removed, starting from the first main surface $S_1$, so as to form a first top cavity 140 and a second top cavity 140, 142, which extend as far as the bottom portion 112_bot of the first dielectric layer 112, thus exposing corresponding parts of the latter. For this purpose, there may be carried out (for example) two etches in succession (for example, a first dry etch and a subsequent wet etch); the first etch may be of an etch-stop type; i.e., it stops once the dielectric material that forms the bottom portion 112_bot of the first dielectric layer 112 is reached. The first and second top cavities 140, 142 traverse the first wafer 100 entirely.

Without this implying any loss of generality, the first and second top cavities 140, 142 are, for example, the same as one another and are arranged in a symmetrical way with respect to the second axis H2 so as to delimit a semiconductor portion 144 of the first wafer 100, which is interposed between the first and second top cavities 140, 142 and is referred to in what follows as the internal semiconductor region 144, the remaining part of the first wafer 100 being in what follows referred to as external semiconductor region 145. Once again without this implying any loss of generality, each of the first and second top cavities 140, 142 has in top plan view a symmetrical shape with respect to the first axis H1.

In detail, the first top cavity 140 separates the internal semiconductor region 144 from a first portion 146 of the external semiconductor region 145. Likewise, the second top cavity 142 separates the internal semiconductor region 144 from a second portion 148 of the external semiconductor region 145.

The internal semiconductor region 144 comprises a central portion 151, a first deformable portion 152 and a second deformable portion 153, and a first end portion 154 and a second end portion 155.

In greater detail, the central portion 151 has, for example, a cylindrical shape, with axis that coincides with the aforementioned third axis H3. Moreover, as illustrated in FIG. 20, where the profile of the first main sub-region 131 of the bottom semiconductor region 130 is represented dashed to facilitate understanding, the base of the central portion 151 of the internal semiconductor region 144 has a diameter larger than the diameter of the first main sub-region 131 of the bottom semiconductor region 130, which is hence entirely overlaid by the central portion 151 of the internal semiconductor region 144, with which it forms a single piece.

In greater detail, a central part of the central portion 151 of the internal semiconductor region 144 overlies the main sub-region 131 of the bottom semiconductor region 130, whereas a peripheral part of the central portion 151 that surrounds the central part of the central portion 151 is laterally staggered with respect to the first main sub-region 131 of the bottom semiconductor region 130, as well as to the second and third main sub-regions 132, 133; hence, it is delimited at the bottom by the bottom portion 112_bot of the first dielectric layer 112.

The first and second deformable portions 152, 153 are arranged on opposite sides of the central portion 151 and are laterally staggered with respect to the first main sub-region 131 of the bottom semiconductor region 130; hence, also these are delimited at the bottom by the bottom portion 112_bot of the first dielectric layer 112 (equivalently, they coat the latter).

The first and second deformable portion 152, 153 moreover form corresponding springs; i.e., they can undergo deformation so as to rotate about an axis parallel to the axis H2. In this connection, appropriate driving mechanisms may be integrated in the first wafer 100. Without this implying any loss of generality, the present description relates to the case of electrostatic driving. For this purpose, each of the first and second deformable portions 152, 153 extends, in top plan view and in resting conditions, parallel to the second axis H2. Moreover, each of the first and second deformable portions 152, 153 comprises a plurality of projecting elements, which extend parallel to the axis X and are to couple electrostatically with corresponding projecting elements, formed, respectively, by the first and second portions 146, 148 of the external semiconductor region 145.

The first and second end portions 154, 155 overlie, respectively, the second and third main sub-regions 132, 133 of the bottom semiconductor region 130. Moreover, the first deformable portion 152 is interposed between the first end portion 154 and the central portion 151 of the internal semiconductor region 144, whereas the second deformable portion 153 is interposed between the second end portion 155 and the central portion 151 of the internal semiconductor region 144. In addition, the first and second end portions 154, 155 are partially coated, respectively, by the first and second residual parts R2, R3 of the top portion 114_top of the second dielectric layer 114.

Figure 17:
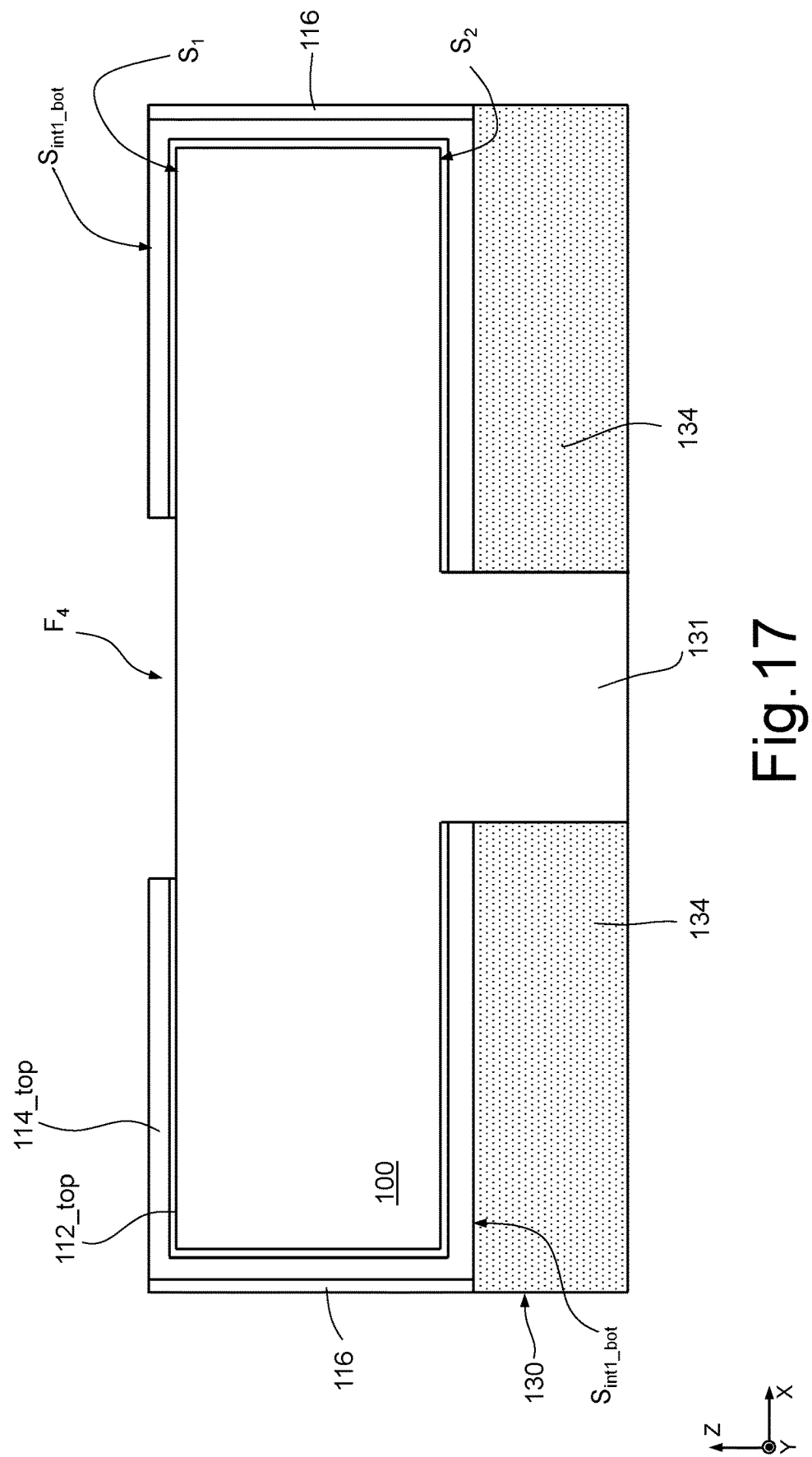

The operations described with reference to FIGS. 19 and 20 do not cause variations of the cross section illustrated in FIG. 17. Moreover, the semiconductor material removed from the first wafer 100 is arranged, in direct contact, on the bottom portion 112_bot of the first dielectric layer 112; hence, control of removal is particularly accurate, thanks to the possibility of adopting etching processes of an etch-stop type.

Figure 21:
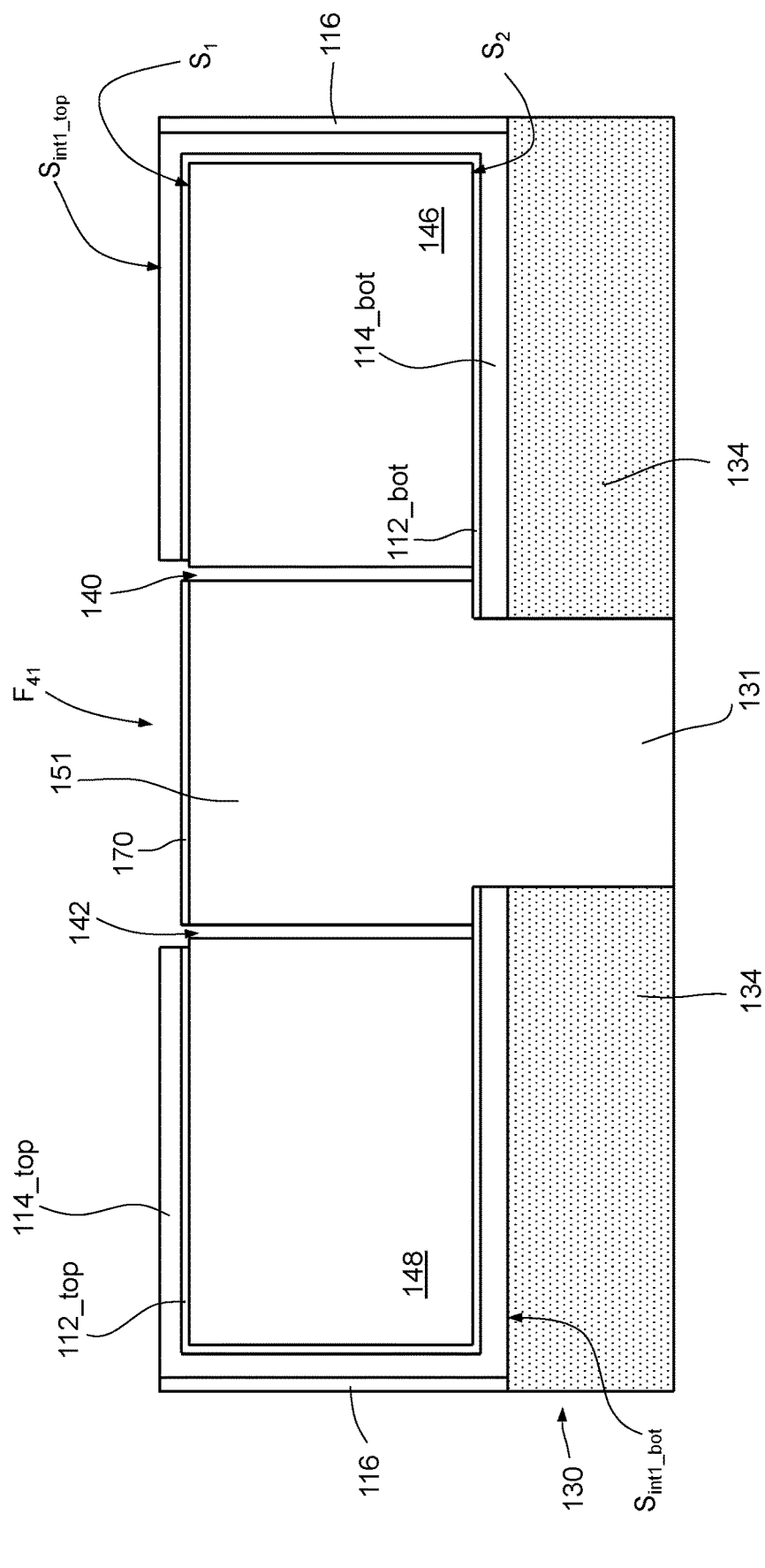

Next, as illustrated in FIG. 21, formed, on the central portion 151 of the internal semiconductor region 144 is a metal region 170, which in use functions as mirror.

Figure 22:
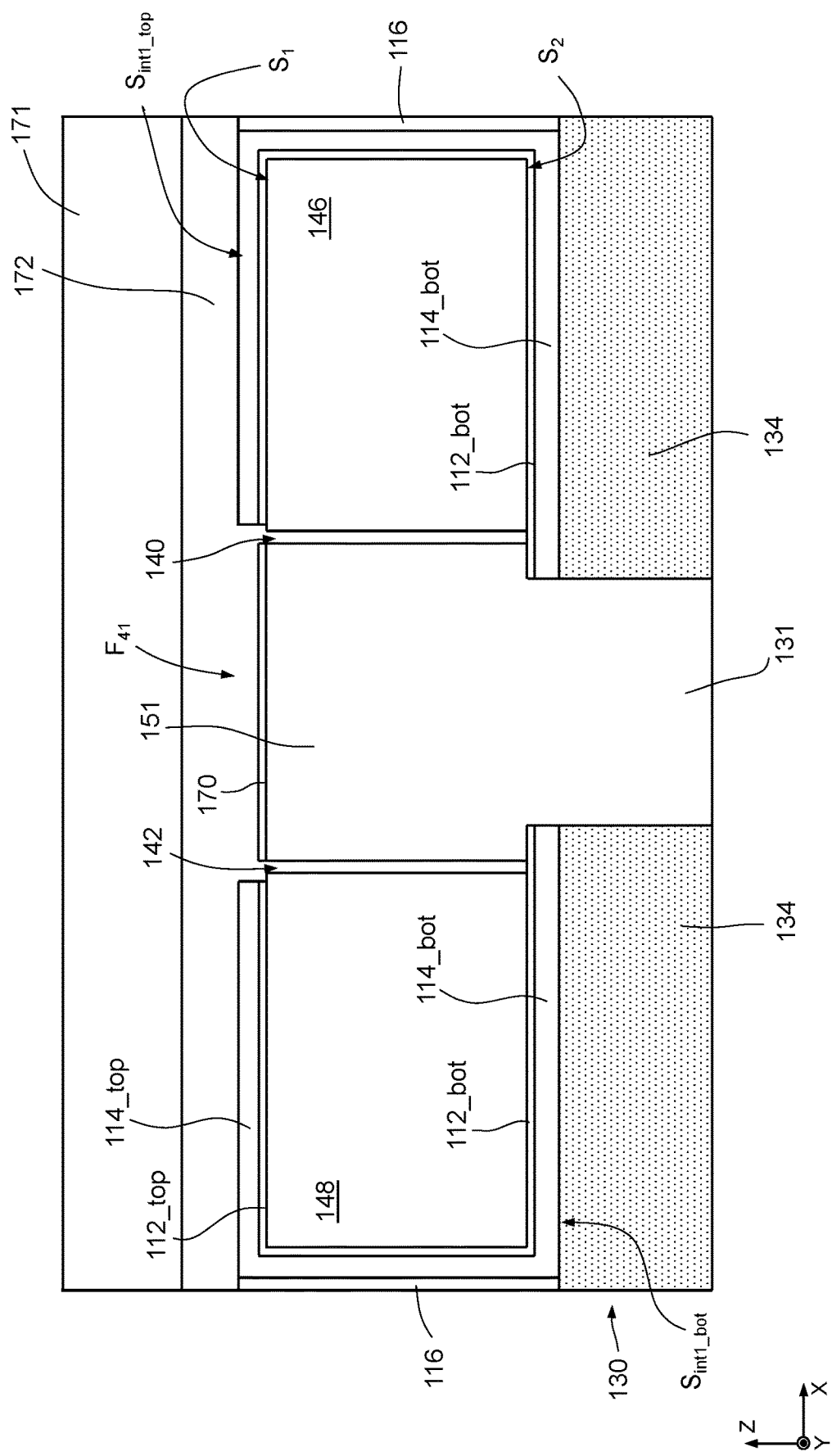

Then (as illustrated in FIG. 22), the front of the first wafer 100 is bonded to a second wafer 171 made of semiconductor material, which functions as support and bestows stiffness in view of subsequent operations of machining of the back of the first wafer 100. In particular, the first wafer 100 is bonded to the second wafer 171 using a bonding region 172, which extends on the first top intermediate surface $S_{int1\_top}$ and on the metal region 170. Moreover, the bonding region 172 fills the first and second top cavities 140, 142 entirely.

Figure 23:
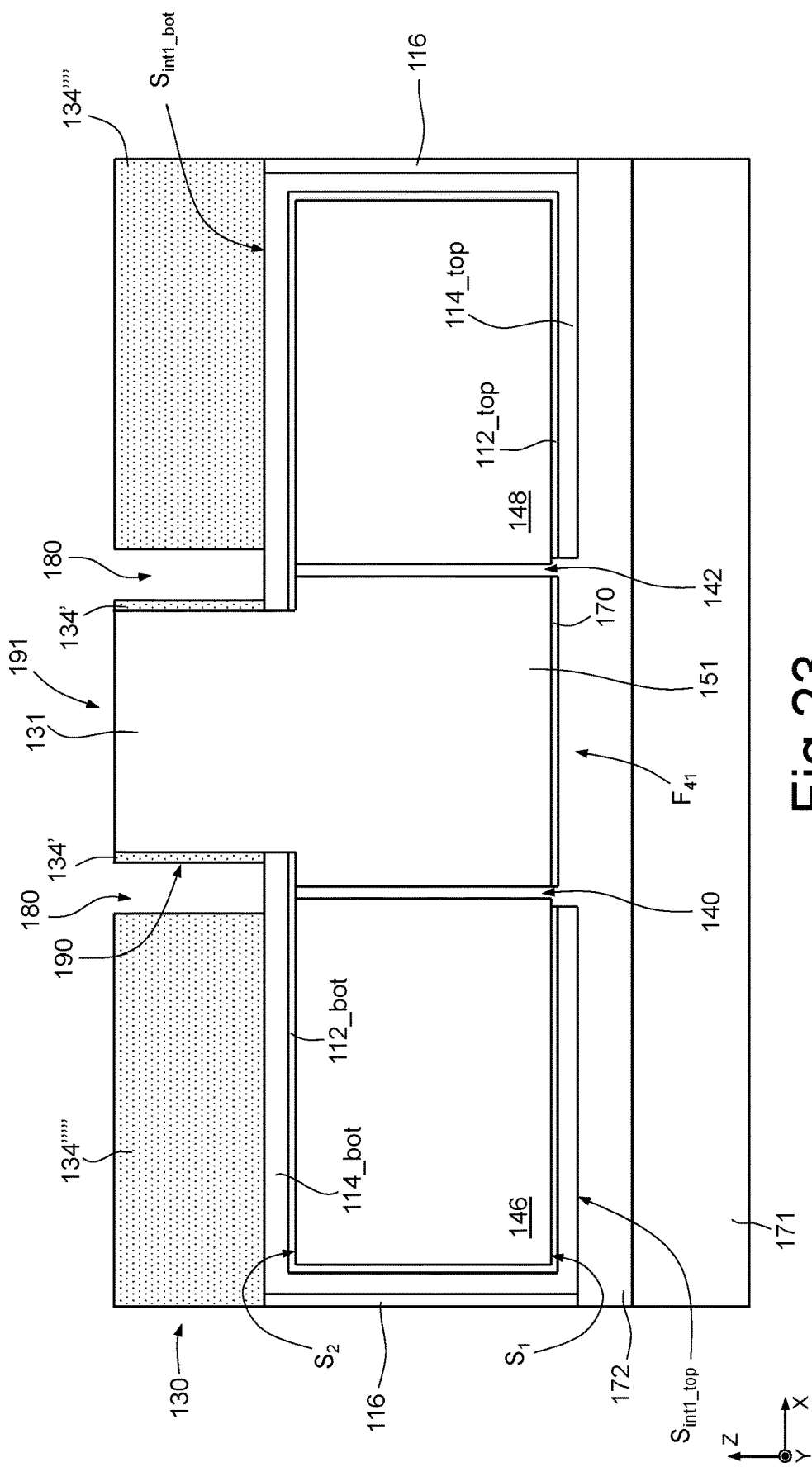
Figure 24:
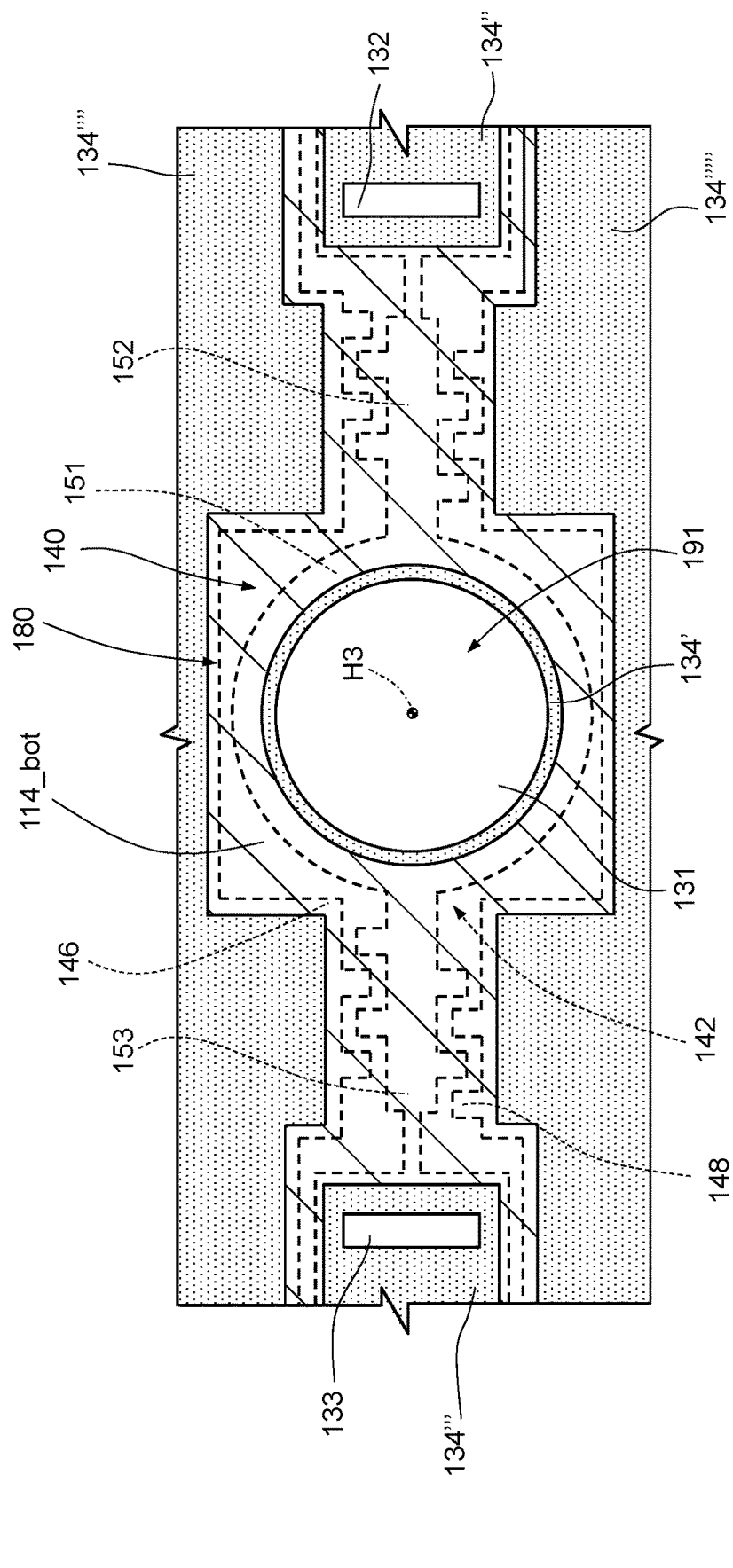
FIG. 24 is a schematic top plan view of a part of the wafer of semiconductor material, during the same step as that of FIG. 23.

Next (as illustrated in FIG. 23), the ensemble formed by the first and second wafers 100, 171 and by the bonding region 172 is flipped over. Then, portions of the bottom semiconductor region 130 are selectively removed so as to form a bottom cavity 180, the shape of which in top plan view is illustrated in FIG. 24. To facilitate understanding, illustrated dashed in FIG. 24 are the profiles of the first and second top cavities 140, 142, and hence also of the internal semiconductor region 144.

In detail, the aforementioned selective removal is carried out by a dry etch, with an etch stop on the bottom portion 114_bot of the second dielectric layer 114. Consequently, the bottom cavity 180 traverses the bottom semiconductor region 130 entirely and is delimited at the top by the first bottom intermediate surface $S_{int1\_bot}$; i.e., it extends as far as the bottom portion 114_bot of the second dielectric layer 114, thus exposing a part of the latter (illustrated with diagonal lines in FIG. 24).

Moreover, the bottom cavity 180 delimits a preliminary stiffening structure 191, formed by the first main sub-region 131 of the bottom semiconductor region 130 and by a first part (designated by 134') of the secondary sub-region 134, which surrounds the main sub-region 131 laterally. The first part 134' of the secondary sub-region 134 is laterally staggered with respect to the first and second top cavities 140, 142.

In particular, in top plan view, the first part 134' of the secondary sub-region 134 is arranged between the first and second top cavities 140, 142. Moreover, with reference to the orientation illustrated in FIG. 23, the bottom cavity 180 has a shape such that the exposed part of the bottom portion 114_bot of the second dielectric layer 114 overlies entirely the parts of the bottom portion 112_bot of the first dielectric layer 112 left exposed by the first and second top cavities 140, 142.

In addition, the bottom cavity 180 separates from one another a second part, a third part, a fourth part, and a fifth part of the secondary sub-region 134 of the bottom semiconductor region 130, these parts being designated, respectively, by 134", 134"', 134"" and 134"".

In detail, the second and third parts 134", 134"' of the secondary sub-region 134 are arranged in a symmetrical way with respect to the first axis H1 and surround, respectively, the second and third main sub-regions 132, 133 of the bottom semiconductor region 130. The fourth and fifth parts 134"', 134"" of the secondary sub-region 134 are arranged in a symmetrical way with respect to the second axis H2 and are arranged underneath the first and second portions 146, 148, respectively, of the external semiconductor region 145, from which they are separated on account of interposition of the bottom portions 112_bot, 114_bot of the first and second dielectric layers 112, 114.

In addition, the bottom cavity 180 extends also underneath the first and second deformable portions 152, 153, and in particular underneath corresponding portions of the bottom portions 112_bot, 114_bot overlaid by the first and second deformable portions 152, 153.

Figure 25:
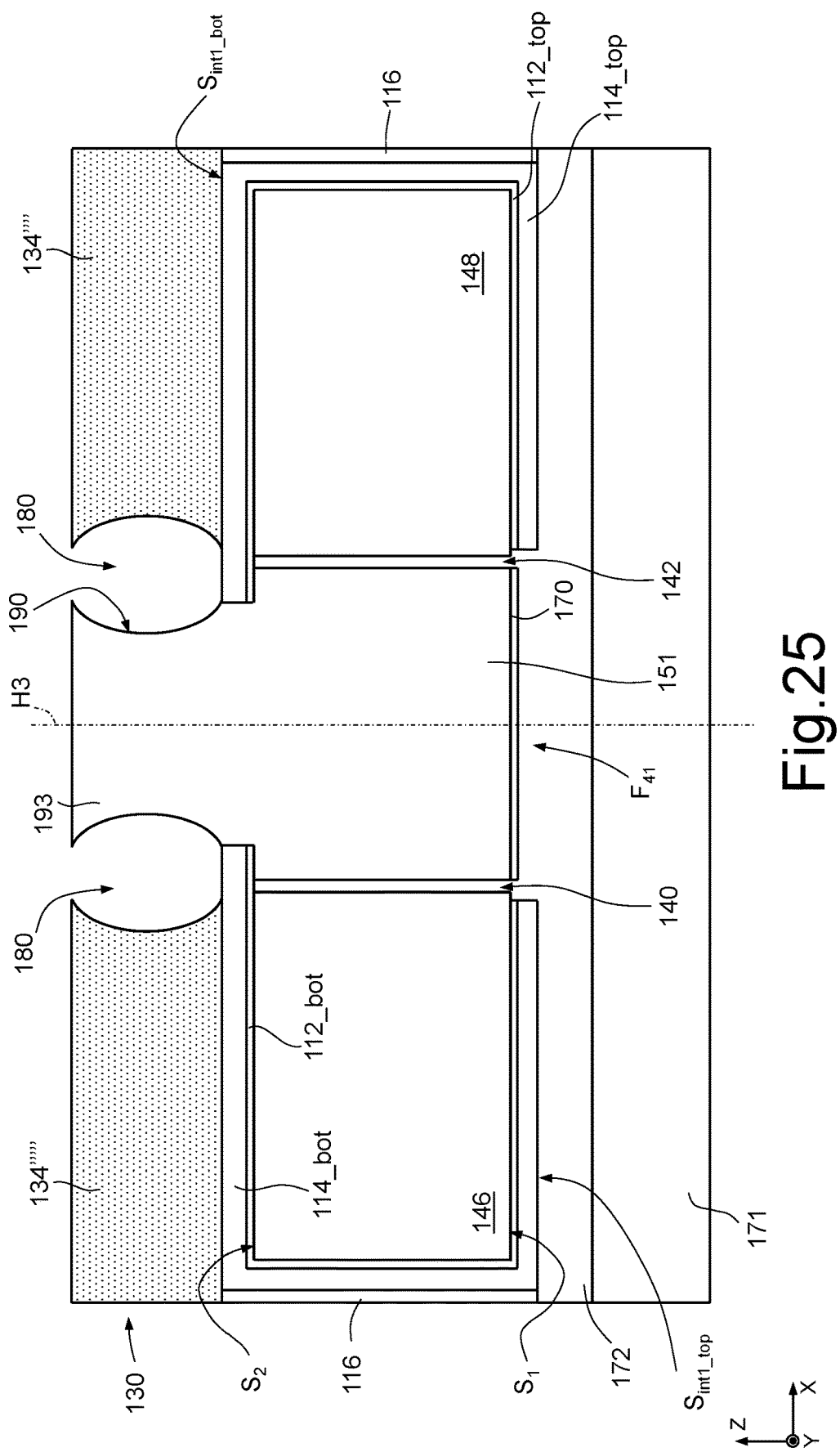

Next, as illustrated in FIG. 25, an etch (for example, an isotropic etch) is carried out so as to pattern the walls of the bottom cavity 180, which were previously vertical. In this connection, this isotropic etch is described with reference to the wall of the top cavity 180 that delimits laterally the first part 134' of the secondary sub-region 134 of the bottom semiconductor region 130 (designated by 190 in FIGS. 23 and 25), even though similar considerations also apply to the other walls of the bottom cavity 180.

In detail, the isotropic etch causes a curving of the wall 190, which assumes a shape with a concavity facing outwards, i.e., with a convexity facing the third axis H3. Moreover, the first part 134' of the secondary sub-region 134 is removed during the isotropic etch, possibly together with peripheral portions of the first main sub-region 131 of the bottom semiconductor region 130. Consequently, the wall 190 is now formed by the residual portion of the first main sub-region 131, designated by 193 in FIG. 25, and referred to in what follows as the stiffening structure 193.

In greater detail, the aforementioned isotropic etch causes, inter alia, an extension in the direction of the third axis H3 of the exposed part of the bottom portion 114_bot of the second dielectric layer 114. From another standpoint, the isotropic etch entails a patterning of the preliminary stiffening structure 191 such that the area of the interface present between the stiffening structure 193 and the first bottom intermediate surface $S_{int1\_bot}$ is small (ideally, it is zero) with respect to the area of the interface present between the preliminary stiffening structure 191 and the first bottom intermediate surface $S_{int1\_bot}$. This entails a further reduction of the mechanical stress in the final device. In any case, the operation of isotropic etching is optional. Moreover, the etch could be of an non-isotropic type.

Figure 26:
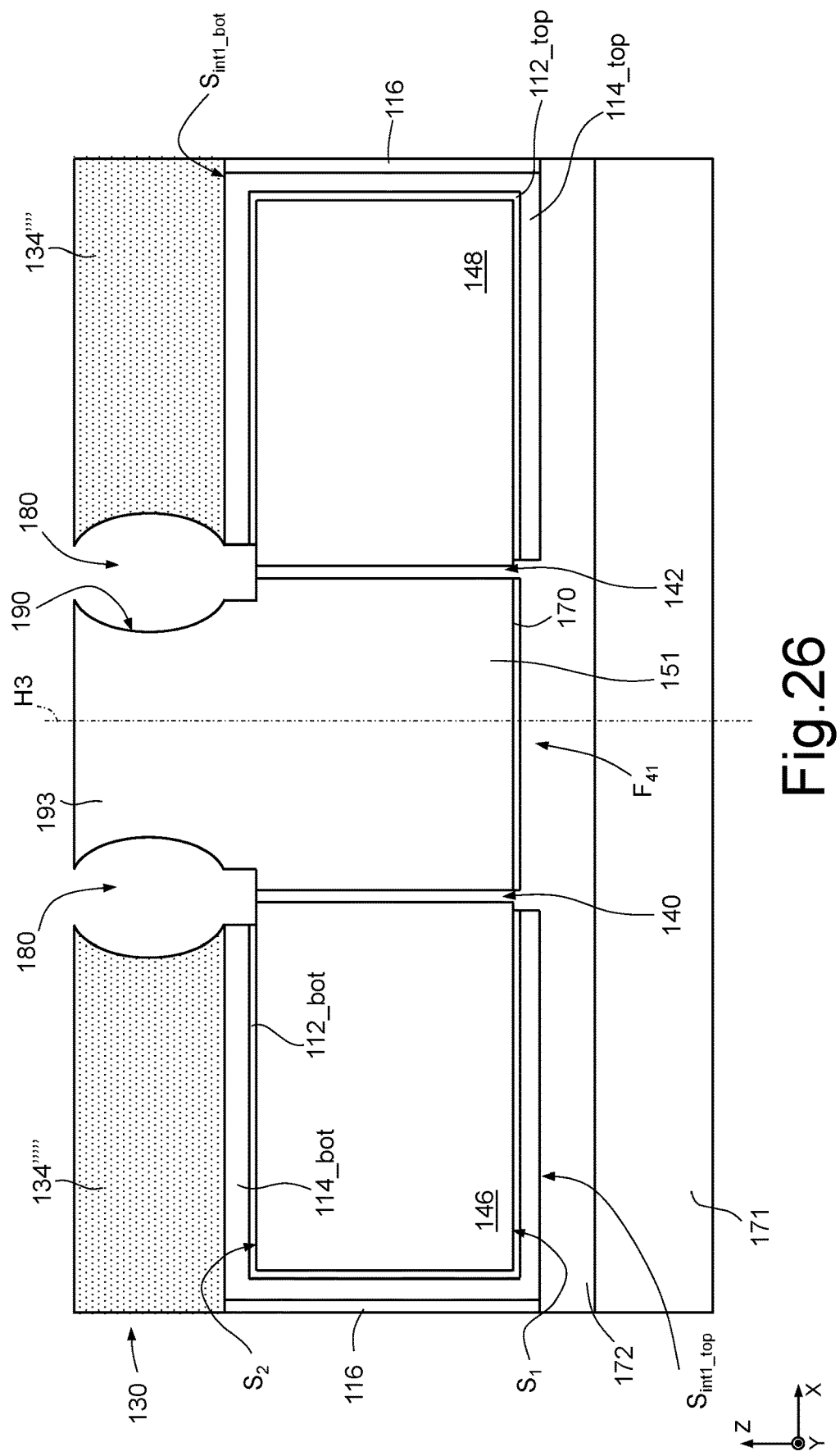

Next, as illustrated in FIG. 26, a further etch, of a dry or wet type, is carried out in order to selectively remove the exposed part of the bottom portion 114_bot of the second dielectric layer 114, as well as an adjacent part of the bottom portion 112_bot of the first dielectric layer 112 in such a way that the bottom cavity 180 becomes in communication with the first and second top cavities 140, 142, filled by the bonding region 172. In other words, there occurs removal of the diaphragm, formed by the exposed part of the bottom portion 114_bot and by the adjacent part of the bottom portion 112_bot, which separated the bottom cavity 180 from the first and second top cavities 140, 142, with consequent formation of a single overall cavity 199 (illustrated in FIG. 27) of a through type partially filled by the bonding region 172.

Next, the ensemble formed by the first and second wafers 100, 171 is again flipped over. The second wafer 171 is detached from the first wafer 100, and a polishing operation is carried out in order to remove possible residual portions of the bonding region 172, to obtain the MEMS device 110 illustrated in FIG. 27.

For practical purposes, the first and second end portions 154, 155 of the internal semiconductor region 144 form a fixed supporting structure of the MEMS device 110, fixed with respect to the first and second portions 146, 148 of the external semiconductor region 145. Moreover, as explained previously, the first and second end portions 154, 155 of the internal semiconductor region 144 are, respectively, fixed with respect to the second and third main sub-regions 132, 133 of the bottom semiconductor region 130, with consequent advantages in terms of resting surface. Moreover, the metal region 170, the central portion 151 of the internal semiconductor region 144, and the stiffening structure 193 form a mobile structure, which is mechanically coupled to the aforementioned fixed supporting structure by the first and second deformable portions 152, 153 and is suspended in the aforementioned overall cavity 199.

Albeit not described in detail, the electrical potentials of the first and second portions 146, 148 of the external semiconductor region 145 and of the first and second deformable portions 152, 153 may be varied (for example, using corresponding electrodes, not illustrated) in such a way as to cause a deformation of the first and second deformable portions 152, 153 and a consequent rotation with respect to a direction parallel to the second axis H2 of the mobile structure. To a first approximation, this rotation does not entail deformation of the mobile structure, thanks to the presence of the stiffening structure 193, i.e., thanks to the fact that, in a direction parallel to the axis Z and in resting conditions, the mobile structure has a thickness greater than the thickness of the springs formed by the first and second deformable portions 152, 153. Moreover, the structure formed by the mobile structure and by the first and second deformable portions 152, 153 is without dielectric-semiconductor interfaces, with consequent reduction of the mechanical stresses to which the mobile structure is subject during rotation.

The MEMS device 110 may be used in a picoprojector 301 adapted to be functionally coupled to a portable electronic apparatus 300, as illustrated hereinafter with reference to FIGS. 28-30.

Figure 1:
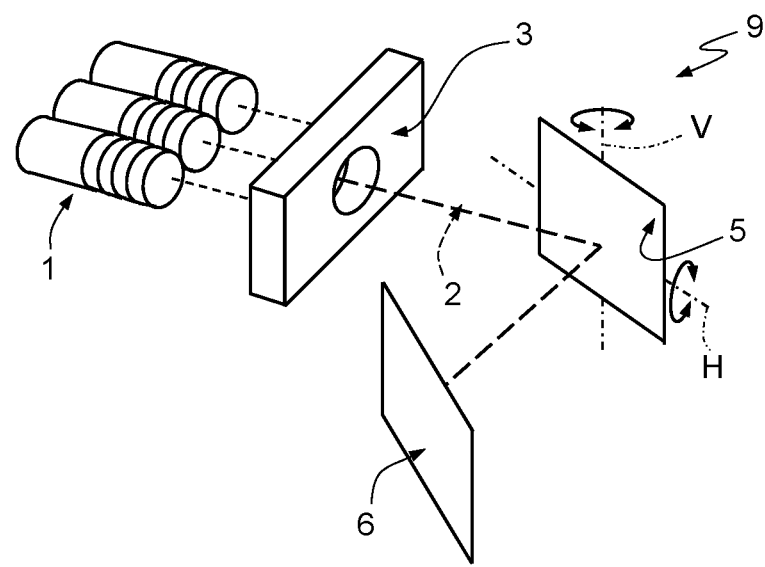
FIG. 1 is a schematic representation of a picoprojector.
Figure 28:
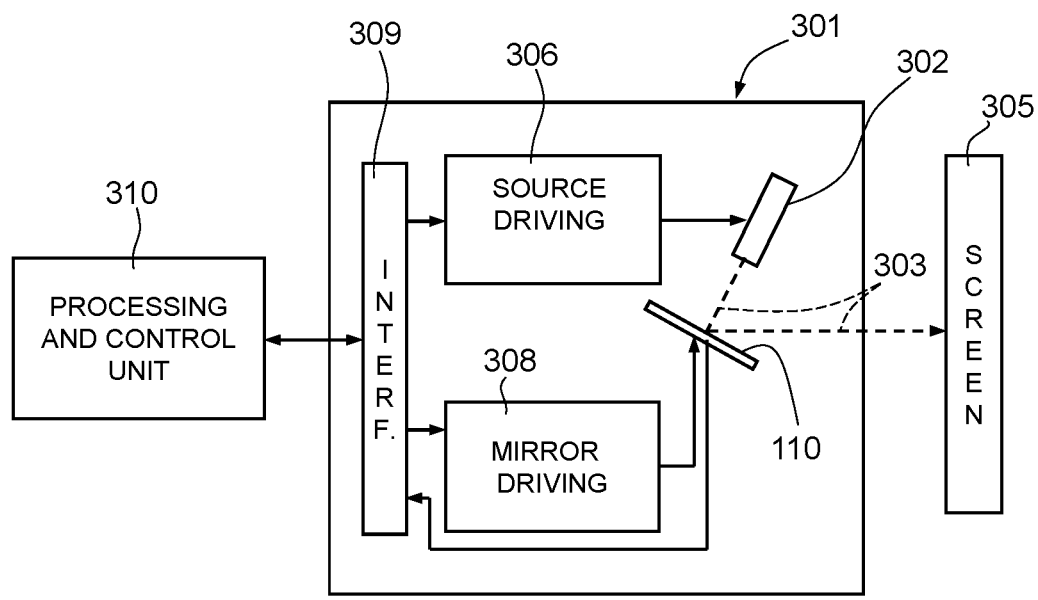
FIG. 28 shows a block diagram of a picoprojector that uses the MEMS device illustrated in FIG. 27.
Figure 2:
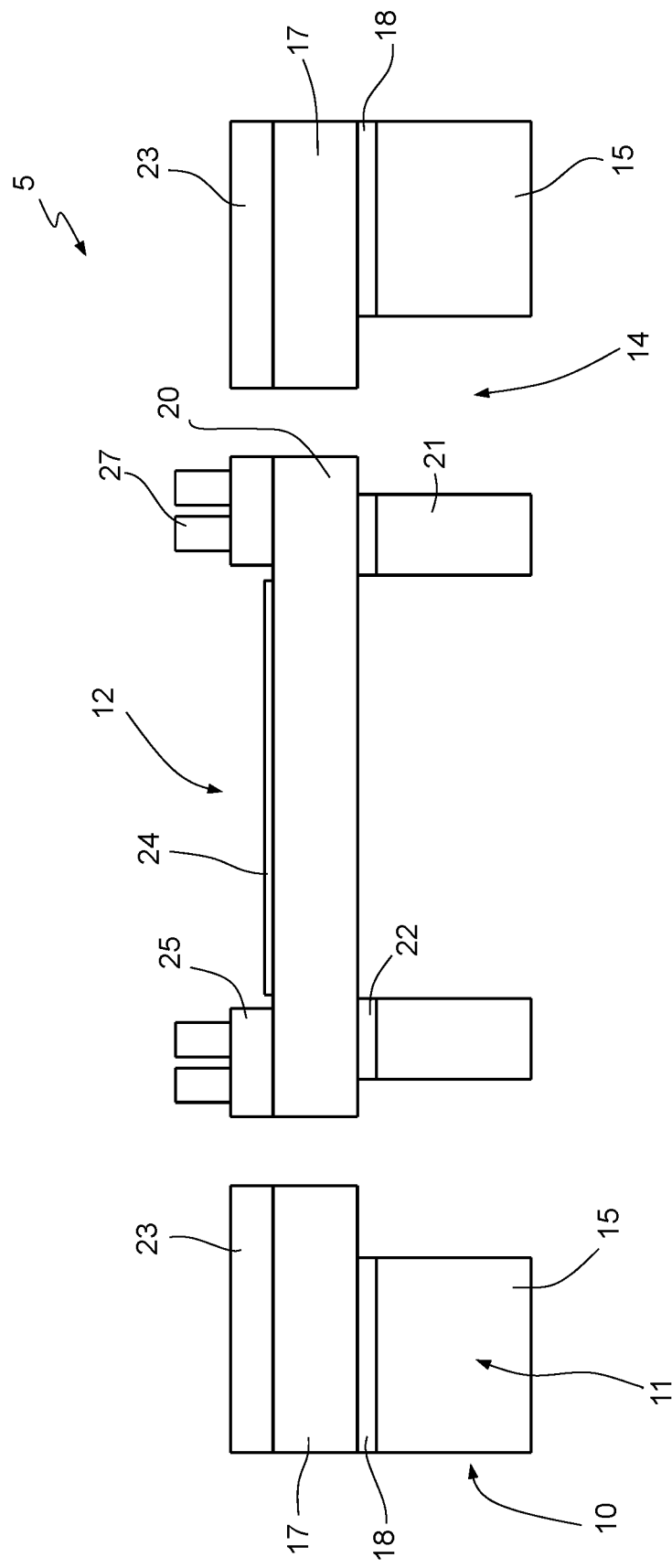
FIG. 2 is a schematic cross-sectional view of a known MEMS device.

In detail, the picoprojector 301 of FIG. 28 comprises: a light source 302, for example of a laser type, adapted to generate a light beam 303; the MEMS device 110, the metal region 170 of which is adapted to receive the light beam 303 and to direct it towards a screen or display surface 305 (which is external and set at a distance from the picoprojector 301 itself); a first driving circuit 306, adapted to supply appropriate control signals to the light source 302, for generation of the light beam 303 according to an image to be projected; a second driving circuit 308, adapted to supply driving signals for rotation of the mobile structure of the MEMS device 110; and a communication interface 309, adapted to receive, from an external control unit 310, for example included in the portable apparatus 300 (FIGS. 29, 30), information on the image to be generated, for example in the form of an array of pixels. The information is sent at input for driving of the light source 302.

Moreover, the control unit 310 may comprise a unit for control of the angular position of the mirror of the MEMS device 110. For this purpose, the control unit 310 can receive through the interface 309 the signals generated by a sensing structure that includes the piezoresistors 30 and can control the second driving circuit 308 accordingly.

Figure 29:
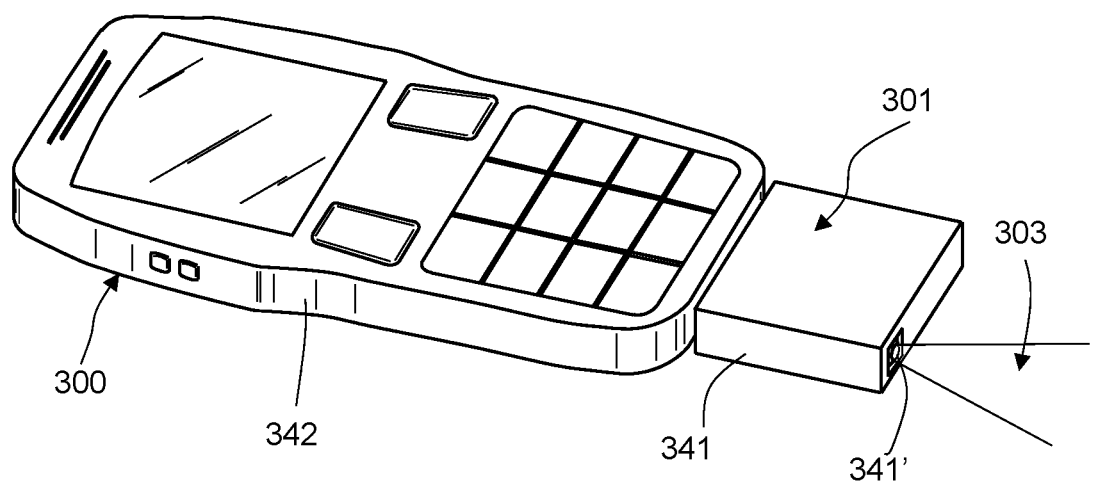
FIGS. 29 and 30 are schematic perspective views regarding variants of coupling between the picoprojector of FIG. 28 and a portable electronic apparatus.

The picoprojector 301 may be obtained as a stand-alone accessory separate from an associated portable electronic apparatus 300, for example a mobile phone or smartphone, as illustrated in FIG. 29. In this case, the picoprojector 301 is coupled to the portable electronic apparatus 300 by appropriate electrical and mechanical connection elements (not illustrated in detail). Here, the picoprojector 301 is provided with a casing 341 of its own, which has at least one portion 341' transparent to the light beam 303 coming from by the MEMS device 110. The casing 341 of the picoprojector 301 is coupled in a releasable way to a casing 342 of the portable electronic apparatus 300.

Figure 30:
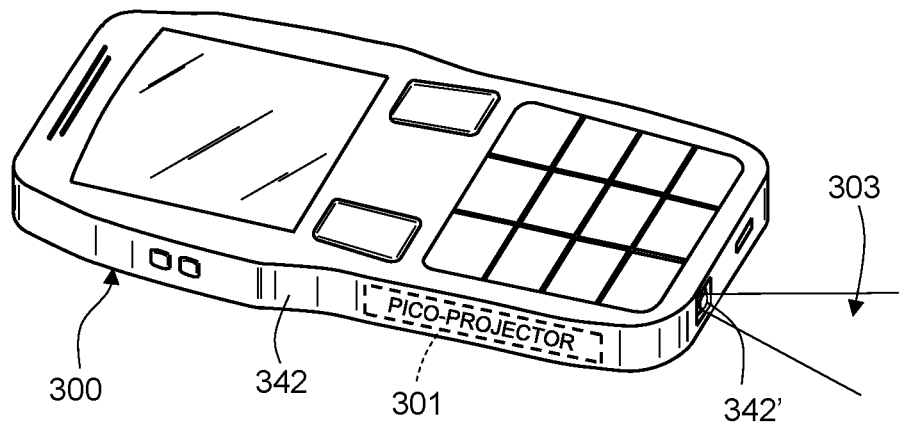

Alternatively, as illustrated in FIG. 30, the picoprojector 301 may be integrated within the portable electronic apparatus 300 and be integrated within the casing 342 of the portable electronic apparatus 300 itself. In this case, the portable electronic apparatus 300 has a respective portion 342' transparent to the light beam 303 coming from the MEMS device 110. The picoprojector 301 is coupled, for example, to a printed circuit present within the casing 342 of the portable electronic apparatus 300.

The advantages that the present manufacturing process affords emerge clearly from the foregoing description.

In particular, the macroregion formed by the bottom portions 112_bot, 114_bot of the first and second dielectric layers 112, 114 functions as an etch stop of a buried type for etches carried out both from the front and from the back of the first wafer 100, which enable definition, respectively, of i) the internal semiconductor region 144 (hence the springs 152, 153 and the central portion 151), and ii) the stiffening structure 193. Subsequently, part of the aforementioned macroregion is removed so as to render the cavities created during the foregoing etches from the back and from the front communicating, thus releasing the mobile structure, which is without dielectric-semiconductor interfaces.

Finally, it is clear that modifications and variations may be made to the device and to the manufacturing process described and illustrated herein, without thereby departing from the scope of protection of this disclosure, as defined in, but not limited by, the annexed claims.

For instance, the number, shape, and composition of the dielectric layers used may vary, as likewise the number and the shape of the windows. For instance, together with the fourth window $F_4$ further top windows may be formed in the case where the shape of the mobile structure is to be more complex. Once again by way of example, the second and third windows $F_2$, $F_3$ may be absent, in which case also the second and third main sub-regions 132, 134 of the bottom semiconductor region 130 are absent, in so far as they are replaced by corresponding portions of the secondary sub-region 134.

It is moreover possible for the number and shape of the springs to be different from what has been described.

Instead of actuators of an electrostatic type, the MEMS device 110 may include actuators of a different type, such as electromagnetic or piezoelectric actuators. Likewise, the sensing mechanism is not necessarily based upon the use of piezoresistors.

Finally, the order in which the etches are carried out may differ from what has been described.

The invention claimed is:

1. A method for manufacturing a microelectromechanical device, comprising:
    delimiting a first semiconductor wafer by a front surface and a rear surface;
    coating the rear surface with a bottom dielectric region;
    forming a first bottom window through the bottom dielectric region;
    forming a bottom semiconductor region that includes a first main sub-region which extends through the first bottom window and contacts the first semiconductor wafer, and a secondary sub-region which coats the bottom dielectric region and laterally surrounds the first main sub-region;
    selectively removing portions of the first semiconductor wafer, starting from the front surface so as to form a first top cavity and a second top cavity that extend as far as the bottom dielectric region and laterally delimit a fixed supporting body and a patterned structure, the patterned structure including a central portion which contacts the first main sub-region of the bottom semiconductor region and a number of deformable portions, interposed between the central portion and the fixed supporting body, in contact with the bottom dielectric region;
    selectively removing portions of the bottom semiconductor region so as to form a bottom cavity that extends through the bottom semiconductor region as far as the bottom dielectric region, and laterally delimits a stiffening region including the first main sub-region of the bottom semiconductor region, the bottom cavity also extending laterally so as to expose parts of the bottom dielectric region that contact the deformable portions and parts of the bottom dielectric region that delimit the first and second top cavities; and
    selectively removing the parts of the bottom dielectric region left exposed by the bottom cavity, in such a way that the first and second top cavities and the bottom cavity form an overall cavity, suspended inside which is the patterned structure.

2. The method according to claim 1, wherein the first semiconductor wafer is comprised of monocrystalline semiconductor material; wherein the step of forming the bottom semiconductor region comprises performing an epitaxial growth such that the first main sub-region of the bottom semiconductor region forms a monolithic monocrystalline region with the first semiconductor wafer; and wherein the secondary sub-region of the bottom semiconductor region is comprised of polycrystalline semiconductor material.

3. The method according to claim 2, wherein the stiffening region includes a portion of the secondary sub-region of the bottom semiconductor region that laterally surrounds the first main sub-region, the portion of the secondary sub-region coating a corresponding portion of the bottom dielectric region which is laterally staggered with respect to the parts of the bottom dielectric region that delimit the first and second top cavities; and further comprising the step of selectively removing sub-portions of the portion of the secondary sub-region, so as to expose a the corresponding portion of the bottom dielectric region, and subsequently carrying out the step of selectively removing the parts of the bottom dielectric region left exposed by the bottom cavity.

4. The method according to claim 1, further comprising coating the front surface of the first semiconductor wafer with a top dielectric region, and forming a top window through the top dielectric region; and wherein the step of selectively removing portions of the first semiconductor wafer starting from the front surface comprises removing portions of the first semiconductor wafer that give out onto the top window.

5. The method according to claim 4, further comprising:
subsequent to formation of the first and second top cavities and prior to the step of selectively removing portions of the bottom semiconductor region, fixing the first semiconductor wafer to a second semiconductor wafer via interposition of a bonding region that extends on the top dielectric region and within the first and second top cavities; and
subsequent to the step of selectively removing the parts of the bottom dielectric region left exposed by the bottom cavity, separating the first semiconductor wafer from the second semiconductor wafer.

6. The method according to claim 1, further comprising forming a metal region on the central portion of the patterned structure.

7. The method according to claim 1, wherein the central portion of the patterned structure is mobile with respect to the fixed supporting body, following deformation of the number of deformable portions.

8. The method according to claim 1, wherein the first and second top cavities laterally delimit a number of peripheral portions, fixed with respect to the bottom dielectric region; wherein each deformable portion of the patterned structure is interposed between the central portion of the patterned structure and a corresponding peripheral portion; and further comprising manufacturing process further comprising forming a number of additional bottom windows through the bottom dielectric region, the step of forming a bottom semiconductor region further comprising forming a number of additional main sub-regions, each of which extends through a corresponding additional bottom window, is laterally staggered with respect to the first main sub-region, and contacts a corresponding peripheral portion.

9. A microelectromechanical (MEMS) device, comprising:
a fixed supporting body of semiconductor material, delimited by a rear surface;
a bottom dielectric region fixed with respect to the fixed supporting body and extending underneath the rear surface;
a patterned region of semiconductor material and suspended in a cavity laterally delimited by the fixed supporting body, the patterned region comprising:
a central portion, which in resting conditions extends above the rear surface; and
a number of deformable portions, each of which is interposed between the central portion and the fixed supporting body; and
an additional semiconductor region forming, together with the central portion of the patterned region, a mobile structure, the additional semiconductor region contacting the central portion of the patterned region and extending, in resting conditions, underneath the rear surface, the mobile structure being mobile with respect to the fixed supporting body, following upon deformation of the number of deformable portions;
wherein the central portion of the patterned region and the additional semiconductor region form a monolithic monocrystalline region.

10. The MEMS device according to claim 9, further comprising a metal region extending on the central portion of the patterned region.

11. A microelectromechanical (MEMS) projector system comprising:
a MEMS device comprising:
a fixed supporting body of semiconductor material, delimited by a rear surface;
a bottom dielectric region fixed with respect to the fixed supporting body and extending underneath the rear surface;
a patterned region of semiconductor material and suspended in a cavity laterally delimited by the fixed supporting body, the patterned region comprising:
a central portion, which in resting conditions extends above the rear surface; and
a number of deformable portions, each of which is interposed between the central portion and the fixed supporting body; and
a metal region extending on the central portion of the patterned region;
an additional semiconductor region forming, together with the central portion of the patterned region, a mobile structure, the additional semiconductor region contacting the central portion of the patterned region and extending, in resting conditions, underneath the rear surface, the mobile structure being mobile with respect to the fixed supporting body, following upon deformation of the number of deformable portions; and
an optical source configured to generate an optical beam that impinges upon the metal region; wherein the central portion of the patterned region and the additional semiconductor region form a monolithic monocrystalline region.

12. A portable electronic apparatus comprising a MEMS projector system according to claim 11.

13. The portable electronic apparatus according to claim 12, wherein the MEMS projector system is a stand-alone accessory having a casing coupled in a releasable way to a respective casing of the portable electronic apparatus.

14. The portable electronic apparatus according to claim 12, wherein the MEMS projector system is formed in an integrated way, within a casing of the portable electronic apparatus.

15. A device, comprising:
a microelectromechanical (MEMS) device, comprising:
   a fixed supporting body of semiconductor material;
   a bottom dielectric region extending underneath a rear surface of the fixed supporting body;
   a patterned region suspended in a cavity laterally delimited by the fixed supporting body, the patterned region comprising:
      a central portion; and
      a plurality of deformable portions, each deformable portion being interposed between the central portion and the fixed supporting body; and
   an additional semiconductor region contacting the central portion of the patterned region and extending underneath the rear surface;
   wherein the central portion of the patterned region and the additional semiconductor region form a monolithic monocrystalline region.

16. The device according to claim 15, further comprising a metal region extending on the central portion of the patterned region.

* * * * *